US012641778B2

(12) United States Patent
Seon et al.

(10) Patent No.: US 12,641,778 B2
(45) Date of Patent: May 26, 2026

(54) SEMICONDUCTOR DEVICES INCLUDING A CONTACT PLUG STRUCTURE ON A METAL SILICIDE LAYER

(71) Applicant: Samsung Electronics Co., Ltd., Suwon-si (KR)

(72) Inventors: Eunbin Seon, Yongin-si (KR); Jonghyun Kim, Hwaseong-si (KR); Hyunjung Lee, Suwon-si (KR); Dohyung Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 576 days.

(21) Appl. No.: 18/116,537

(22) Filed: Mar. 2, 2023

(65) Prior Publication Data

US 2023/0328968 A1      Oct. 12, 2023

(30) Foreign Application Priority Data

Apr. 12, 2022     (KR) ........................ 10-2022-0045009

(51) Int. Cl.
H10B 12/00 (2023.01)

(52) U.S. Cl.
CPC ......... H10B 12/485 (2023.02); H10B 12/482 (2023.02)

(58) Field of Classification Search
CPC .. H10B 12/02; H10B 12/0335; H10B 12/053; H10B 12/315; H10B 12/48; H10B 12/482; H10B 12/485; H10B 12/50; H01L 21/76895; H01L 23/481; G11C 11/4097
See application file for complete search history.

(56) References Cited

U.S. PATENT DOCUMENTS

| | | | |
|---|---|---|---|
| 6,878,627 B1 | 4/2005 | Lur et al. | |
| 7,238,612 B2 | 7/2007 | Yun et al. | |
| 7,312,150 B2 | 12/2007 | Yun et al. | |
| 8,187,970 B2 | 5/2012 | Ganguli et al. | |
| 2002/0186601 A1* | 12/2002 | Lee ................... | H01L 21/76889 257/E21.585 |
| 2004/0017010 A1 | 1/2004 | Sohn et al. | |

(Continued)

FOREIGN PATENT DOCUMENTS

| | | |
|---|---|---|
| KR | 100422906 B1 | 3/2004 |
| KR | 100555541 B1 | 3/2006 |
| KR | 1020100036594 A | 4/2010 |

OTHER PUBLICATIONS

Dong Kyun Sohn, et. al., "Effects of Ti—Capping on Formation and Stability of Co Silicide I. Solid Phase Reaction of Ti to Co/Si System, " Journal of The Electrochemical Society, 2000, pp. 373-380.

(Continued)

*Primary Examiner* — Hoai V Pham

(74) *Attorney, Agent, or Firm* — Muir Patent Law, PLLC

(57) ABSTRACT

A semiconductor device includes a metal silicide layer on a substrate, and a contact plug structure on the metal silicide layer. The contact plug structure includes a metal pattern including a first metal, and a first barrier pattern covering a lower surface and a sidewall of the metal pattern and contacting the metal silicide layer. The first barrier pattern includes a second metal. The metal silicide layer includes silicon, the second metal, and a third metal different from the second metal.

14 Claims, 43 Drawing Sheets

(56) References Cited

U.S. PATENT DOCUMENTS

| 2005/0272235 | A1* | 12/2005 | Wu | ................... | H01L 21/28518 |
| | | | | | 257/E21.165 |
| 2007/0181954 | A1* | 8/2007 | Oikawa | ............. | H01L 21/76834 |
| | | | | | 257/E21.627 |
| 2009/0209096 | A1 | 8/2009 | Lee et al. | | |
| 2013/0200525 | A1 | 8/2013 | Lee et al. | | |
| 2014/0248761 | A1* | 9/2014 | Park | ..................... | H10D 84/038 |
| | | | | | 438/586 |
| 2017/0069726 | A1* | 3/2017 | Kye | ...................... | H01L 23/485 |
| 2022/0069101 | A1 | 3/2022 | Choi et al. | | |

OTHER PUBLICATIONS

Hannes Schiesche, et al., "Effect of a Ti diffusion barrier on the cobalt silicide formation: solid solution, segregation and reactive diffusion," Acta Materialia, 2021.

M. Setton and J. Van Der Spiegel, "Siilhcrde Formation for Co/Ti/Si Structures Processed by RT~ Under Vacuum," Applied Surface Science, 1989, 62-71.

Office Action dated Dec. 26, 2023 from the Taiwan Intellectual Property Office for corresponding Taiwanese Patent Application No. 112110320.

* cited by examiner

SEMICONDUCTOR DEVICES INCLUDING A CONTACT PLUG STRUCTURE ON A METAL SILICIDE LAYER

CROSS-REFERENCE TO RELATED APPLICATION

This application claims priority under 35 U.S.C. § 119 to Korean Patent Application No. 10-2022-0045009 filed on Apr. 12, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a dynamic random access memory (DRAM) device including a contact plug structure.

DISCUSSION OF RELATED ART

A metal silicide layer may be formed between a substrate including silicon and a contact plug including metal so as to increase the ohmic contact characteristics.

However, during a heat treatment process for forming the metal silicide layer, the metal silicide layer may be overgrown to cause leakage current.

SUMMARY

Example embodiments provide a semiconductor device having improved characteristics.

According to example embodiments of the inventive concepts, a semiconductor device includes a metal silicide layer on a substrate, and a contact plug structure on the metal silicide layer. The contact plug structure includes a metal pattern including a first metal, and a first barrier pattern covering a lower surface and a sidewall of the metal pattern and contacting the metal silicide layer. The first barrier pattern includes a second metal. The metal silicide layer includes silicon, the second metal, and a third metal different from the second metal.

According to example embodiments of the inventive concepts, a semiconductor device includes a metal silicide layer on a substrate, the metal silicide layer including cobalt titanium silicide ($CoTi_xSi_y$), x and y being real numbers, and a contact plug structure on the metal silicide layer. The contact plug structure includes a metal pattern including a first metal, a first barrier pattern lining a lower surface and a sidewall of the metal pattern, the first barrier pattern including nitride of a second metal, and a second barrier pattern lining a lower surface and a sidewall of the first barrier pattern and contacting the metal silicide layer, the second barrier pattern including titanium.

According to example embodiments of the inventive concepts, a semiconductor device includes a substrate including a cell region and a peripheral circuit region, a first gate structure extending in a first direction substantially parallel to an upper surface of the substrate in the cell region, a bit line structure on the cell region of the substrate, the bit line structure extending in a second direction substantially parallel to the upper surface of the substrate and crossing the first direction, a first contact plug structure on a portion of the substrate adjacent to the bit line structure, a capacitor on the first contact plug structure, a second gate structure on the peripheral circuit region of the substrate, a second contact plug structure on a portion of the substrate adjacent to the second gate structure, and a metal silicide layer on the substrate, the metal silicide layer contacting a lower surface of the second contact plug structure. The second contact plug structure includes a metal pattern including a first metal, and a first barrier pattern covering a lower surface and a sidewall of the metal pattern and contacting the metal silicide layer, the first barrier pattern including a second metal. The metal silicide layer includes silicon, the second metal, and a third metal different from the second metal.

In the semiconductor device in accordance with example embodiments, the metal silicide layer between the contact plug structure and the substrate may not excessively grow into a lower portion of the substrate, and a contact area with a lower surface of the contact plug structure may increase. Thus, leakage current through the metal silicide layer may decrease, and a contact resistance between the metal silicide layer and the contact plug structure may decrease.

BRIEF DESCRIPTION OF THE DRAWINGS

FIGS. 10 to 46 are plan views and cross-sectional views illustrating a method of manufacturing a semiconductor device according to example embodiments.

DETAILED DESCRIPTION

The above and other aspects and features of a semiconductor device and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer, or section. Thus, a first element, component, region, layer, or section discussed below could be termed a second or third element, component, region, layer, or section without departing from the teachings of inventive concepts.

FIGS. 1 to 6 are cross-sectional views illustrating a method of manufacturing a semiconductor device including a contact plug structure according to example embodiments.

Figure 1:
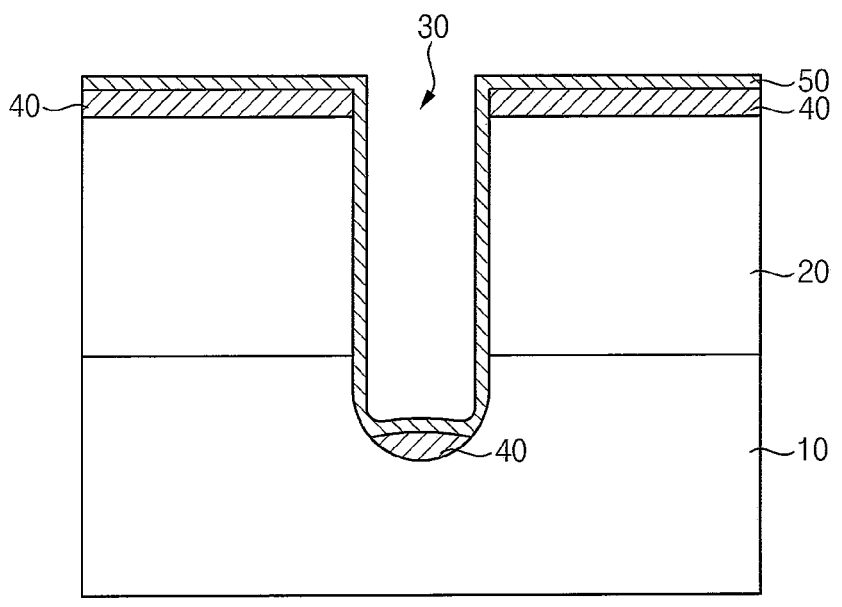
FIGS. 1 to 6 are cross-sectional views illustrating a method of manufacturing a semiconductor device including a contact plug structure according to example embodiments.

Referring to FIG. 1, a first insulating interlayer 20 may be formed on a substrate 10, and the first insulating interlayer 20 and an upper portion of the substrate 10 may be partially etched to form a recess 30.

The substrate 10 may include or may be formed of silicon, germanium, silicon-germanium, etc., and the first insulating interlayer 20 may include or may be formed of oxide, e.g., silicon oxide, or nitride, e.g., silicon nitride.

A first metal layer 40 may be formed on a bottom of the recess 30 and an upper surface of the first insulating interlayer 20, and a first capping layer 50 may be formed on a sidewall of the recess 30 and an upper surface of the first metal layer 40.

The first metal layer 40 may be formed by a deposition process having low gap-filling characteristics, e.g., a physical vapor deposition (PVD) process, and thus may not be formed on the sidewall of the recess 30, but may be formed only on the bottom of the recess 30 and the upper surface of the first insulating interlayer 20. In an embodiment, the first metal layer 40 may be formed by a chemical vapor deposition (CVD) process or an atomic layer deposition (ALD) process.

The first metal layer 40 may include or may be formed of metal, e.g., cobalt, nickel, titanium, platinum, molybdenum, sodium, manganese, tungsten, zirconium, etc.

The first capping layer 50 may be formed by, e.g., a CVD process, an ALD process, a PVD process, etc. The first capping layer 50 may include or may be formed of metal nitride, e.g., titanium nitride, tantalum nitride, etc.

Figure 2:
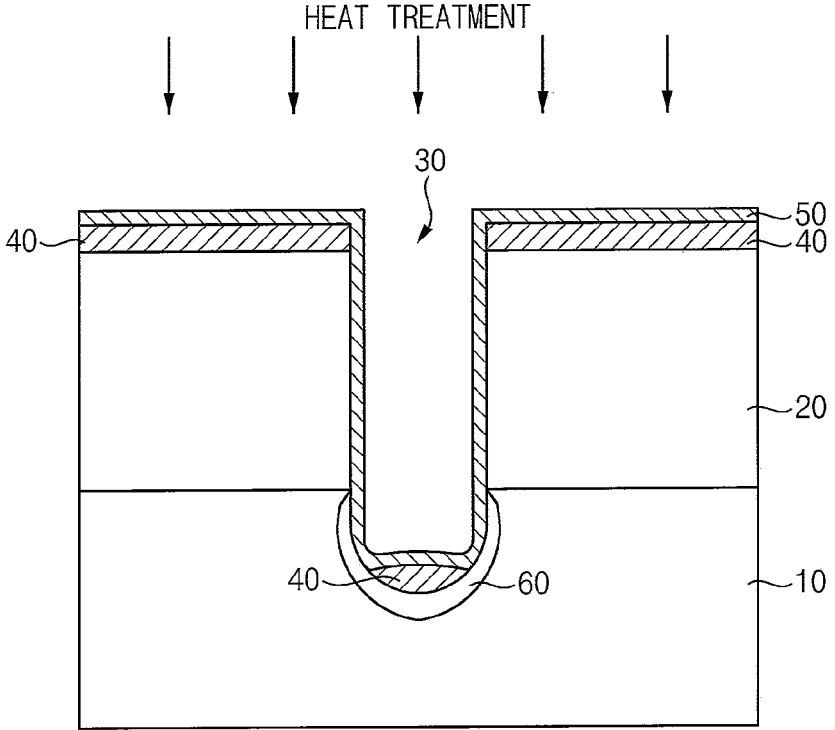

Referring to FIG. 2, a first heat treatment process may be performed on the substrate 10 having the first metal layer 40 and the first capping layer 50 thereon.

In example embodiments, the first heat treatment process may be performed by a rapid thermal annealing (RTA) process at a temperature between about 450° C. and about 600° C. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

By the first heat treatment process, the metal included in the first metal layer 40 and, e.g., silicon included in the substrate 10 may be reacted with each other to form a preliminary metal silicide layer 60.

For example, if the first metal layer 40 includes or is formed of cobalt, the preliminary metal silicide layer 60 may include or may be formed of cobalt monosilicide (CoSi) and/or cobalt disilicide (CoSi$_2$). The preliminary metal silicide layer 60 may be formed at a portion of the substrate 10 adjacent to the bottom of the recess 30.

Figure 3:
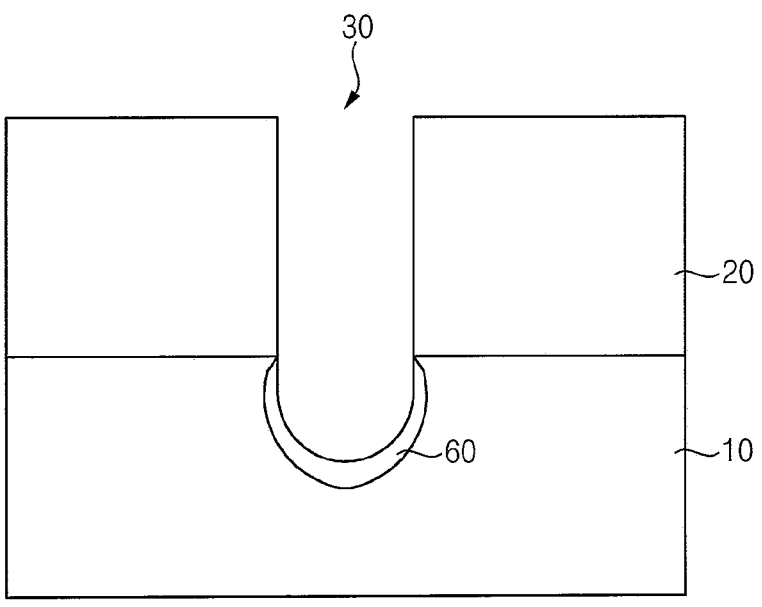

Referring to FIG. 3, the first capping layer 50 and the first metal layer 40 may be removed to expose an upper surface of the preliminary metal silicide layer 60 and the upper surface of the first insulating interlayer 20.

In example embodiments, the first capping layer 50 and the first metal layer 40 may be removed by, e.g., a stripping process, and the preliminary metal silicide layer 60 may be exposed.

Figure 4:
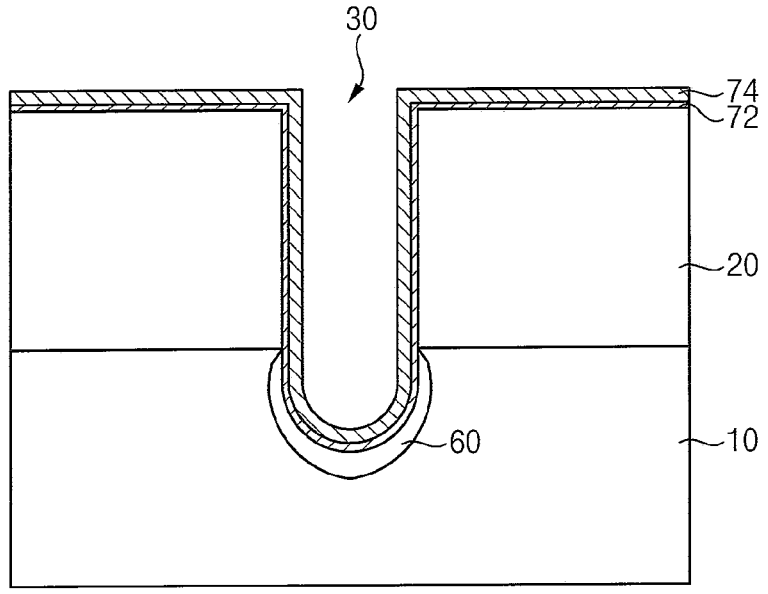

Referring to FIG. 4, first and second barrier layers 72 and 74 may be sequentially formed on the exposed upper surfaces of the preliminary metal silicide layer 60 and the first insulating interlayer 20 and the sidewall of the recess 30.

In example embodiments, the first barrier layer 72 may include or may be formed of metal, e.g., titanium, tantalum, etc., the second barrier layer 74 may include or may be formed of a metal nitride, e.g., titanium nitride, tantalum nitride, etc.

The first barrier layer 72 may increase the adhesion between the second barrier layer 74 and the first insulating interlayer 20.

Figure 5:
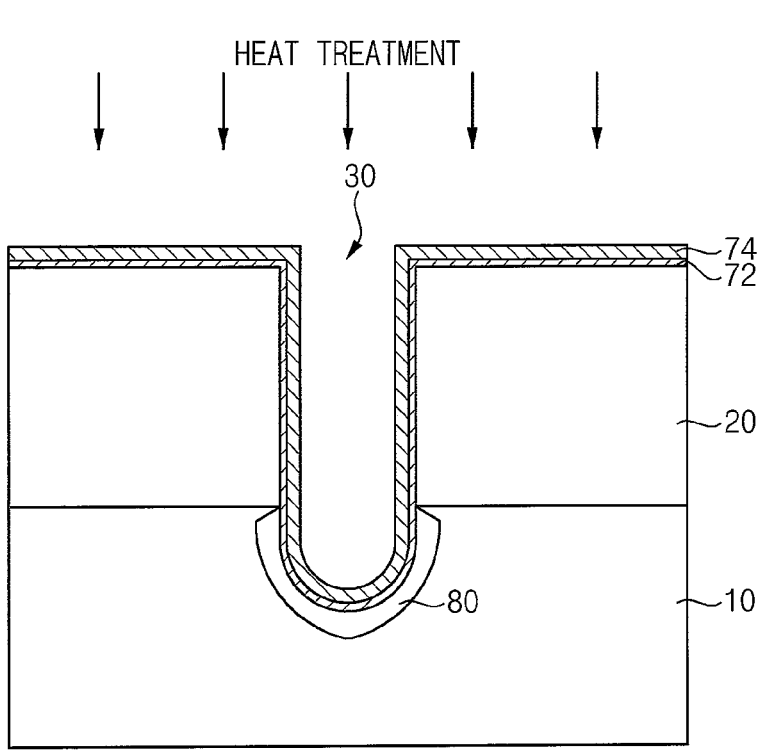

Referring to FIG. 5, a second heat treatment process may be performed on the substrate 10 having the preliminary metal silicide layer 60 and the first and second barrier layers 72 and 74.

In example embodiments, the second heat treatment process may be performed by an RTA process at a temperature between about 600° C. and about 800° C.

By the second heat treatment process, the preliminary metal silicide layer 60 may be converted into a first metal silicide layer 80. The cobalt monosilicide (CoSi) included in the preliminary metal silicide layer 60 may be converted into cobalt disilicide (CoSi$_2$).

When the second heat treatment process is performed, a metal included in the first barrier layer 72 contacting an upper surface of the preliminary metal silicide layer 60 may diffuse into the preliminary metal silicide layer 60, and thus may be combined with a metal silicide included in the preliminary metal silicide layer 60. The term "contact," as used herein, refers to a direct connection (i.e., touching) unless the context indicates otherwise.

For example, if the preliminary metal silicide layer 60 includes or is formed of cobalt monosilicide (CoSi) and/or cobalt disilicide (CoSi$_2$) and the first barrier layer 72 includes or is formed of titanium, the titanium included in the first barrier layer 72 and the cobalt included in the preliminary metal silicide layer 60 may be combined with (i.e., react) each other to form cobalt titanium silicide (CoTi$_x$Si$_y$), where x and y are real numbers.

As titanium and cobalt are combined with (i.e., react) each other during the second heat treatment process, the cobalt included in the preliminary metal silicide layer 60 may not excessively provided into a lower portion of the substrate 10 so as to prevent the excessive growth of the first metal silicide layer 80 at the lower portion of the substrate 10. For example, during the second heat treatment process, the titanium of the first barrier layer 72 may be diffused into the preliminary metal silicide layer 60 to react with cobalt thereof. The reaction of titanium and cobalt may prevent the cobalt included in the preliminary metal silicide layer 60 from excessively diffusing into the substrate 10, thereby preventing the excessive growth of the first metal silicide layer 80 into the substrate 10, which may be a cause of leakage current.

As the cobalt included in the preliminary metal silicide layer 60 is combined with the titanium included in the first barrier layer 72, the cobalt may not be provided into the lower portion of the substrate 10, but may be provided into an upper portion of the substrate 10 adjacent to the recess 30, that is, a portion of the substrate 100 contacting the first barrier layer 72, and thus cobalt disilicide (CoSi$_2$) and cobalt titanium silicide (CoTi$_x$Si$_y$) may be formed in the portion of the substrate 100 contacting the first barrier layer 72. Accordingly, a contact area between the first metal silicide layer 80 and the first barrier layer 72 may increase, so that a contact resistance between the first barrier layer 72 and the first metal silicide layer 80 may decrease.

For example, if the second heat treatment process is performed before the first and second barrier layers 72 and 74 are formed, for example, cobalt included in the preliminary metal silicide layer 60 may be provided into the lower portion of the substrate 10 by the second heat treatment process, and thus the first metal silicide layer 80 may have a relatively large volume at the lower portion of the substrate 10 under the recess 30. Thus, a leakage current through the first metal silicide layer 80 may increase.

Additionally, when the second heat treatment process is performed before the first and second barrier layers 72 and 74 are formed, the cobalt included in the preliminary metal silicide layer 60 is mainly provided into the lower portion of the substrate 10 under the recess 30, so as not to be provided into the upper portion of the substrate 10 adjacent to the recess 30. Thus, the first metal silicide layer 80 may be rarely formed at the upper portion of the substrate 10. Accordingly, the contact area between the first metal silicide layer 80 and the first barrier layer 72 may not be sufficiently secured to reduce contact resistance.

However, in example embodiments, the second heat treatment process may be performed after forming the first and second barrier layers 72 and 74, the metal included in the first barrier layer 72 may be combined with the metal and the silicon included in the preliminary metal silicide layer 60, so that the first metal silicide layer 80 may be prevented from excessively growing under the recess 30, while the metal included in the preliminary metal silicide layer 60 may be provided into the upper portion of the substrate 10 contacting the first barrier layer to have a large area contacting the first barrier layer 72. Accordingly, the leakage current through the first metal silicide layer 80 may decrease, and the contact resistance between the first metal silicide layer 80 and the first and second barrier layers 72 and 74 may decrease.

Figure 6:
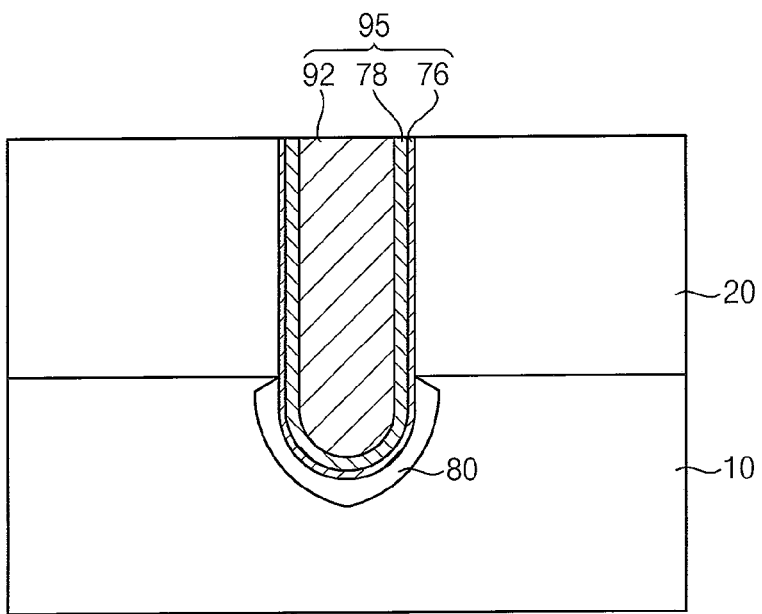

Referring to FIG. 6, a second metal layer may be formed on the second barrier layer 74 to fill the recess 30, and the second metal layer and the first and second barrier layers 72 and 74 may be planarized to expose the upper surface of the first insulating interlayer 20.

The second metal layer may include or may be formed of metal, e.g., tungsten, titanium, tantalum, etc.

Thus, a second metal pattern 92, a second barrier pattern 78 covering a lower surface and a sidewall of the second metal pattern 92, and a first barrier pattern 76 covering a lower surface and a sidewall of the second barrier pattern 78 may be formed in the recess 30, which may form a contact plug structure 95.

By the above processes, the semiconductor device including the contact plug structure 95 on the substrate 10 including a semiconductor material, and the first metal silicide layer 80 between the substrate 10 and the contact plug structure 95 may be manufactured.

The semiconductor device may have following structural characteristics.

In an embodiment, the semiconductor device may include the first metal silicide layer 80 including a metal silicide at the portion of the substrate 10 adjacent to the bottom of the recess 30 on the substrate 10, and the contact plug structure 95 contacting the first metal silicide layer 80. A lower portion of the contact plug structure 95 may fill the recess 30.

In example embodiments, the contact plug structure 95 may include the second metal pattern 92 including a first metal, the second barrier pattern 78 covering the lower surface and the sidewall of the second metal pattern 92 and including a nitride of a second metal, and the first barrier pattern 76 covering the lower surface and the sidewall of the second barrier pattern 78, contacting the first metal silicide layer 80 and including a third metal.

In example embodiments, the first metal silicide layer 80 may include or may be formed of the third metal, a fourth metal different from the third metal, and silicon. In an example embodiment, the third metal may be titanium, and the fourth metal may include or may be formed of cobalt, so that the first metal silicide layer 80 may include cobalt titanium silicide ($CoTi_xSi_y$), where x and y are real numbers.

In an example embodiment, the second and third metals may be substantially the same as each other, and thus the first barrier pattern 76 may include or may be formed of titanium and the second barrier pattern 78 may include or may be formed of titanium nitride. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

In an example embodiment, the first metal may include or may be formed of tungsten.

Figures 7, 8:
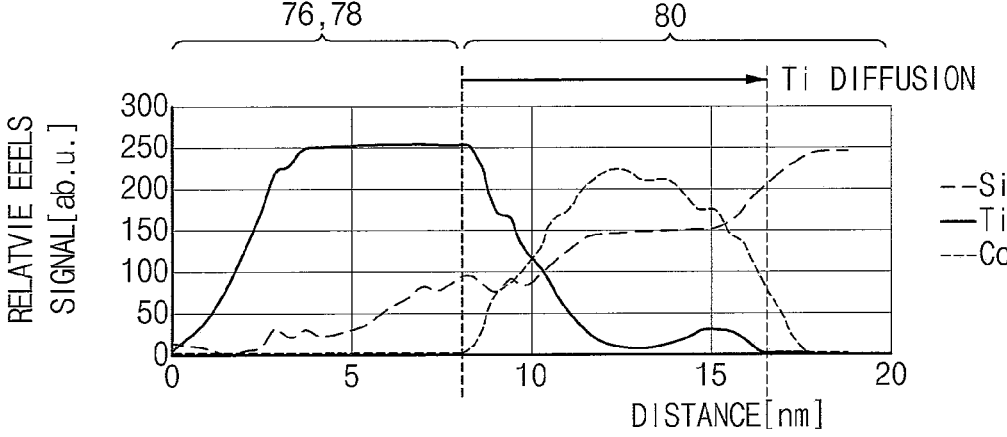
FIG. 7 is a graph illustrating concentrations of titanium, cobalt and silicon included in first and second barrier patterns and a first metal silicide layer adjacent thereto in the semiconductor device in accordance with example embodiments.
FIGS. 8 and 9 are cross-sectional views illustrating a method of manufacturing a semiconductor device including a contact plug structure in accordance with example embodiments.

FIG. 7 is a graph illustrating concentrations of titanium, cobalt and silicon included in the first and second barrier patterns 76 and 78 and the first metal silicide layer 80 adjacent thereto in a semiconductor device in accordance with example embodiments.

Referring to FIG. 7, titanium included in the first and second barrier patterns 76 and 78 diffuses into the first metal silicide layer 80 including cobalt silicide, so that the titanium remains in the first metal silicide layer 80.

Thus, a concentration of titanium of a portion of the first metal silicide layer 80 adjacent to the first barrier pattern 76 may be greater than a concentration of titanium of a portion of the first metal silicide layer 80 adjacent to the substrate 10.

Figure 9:
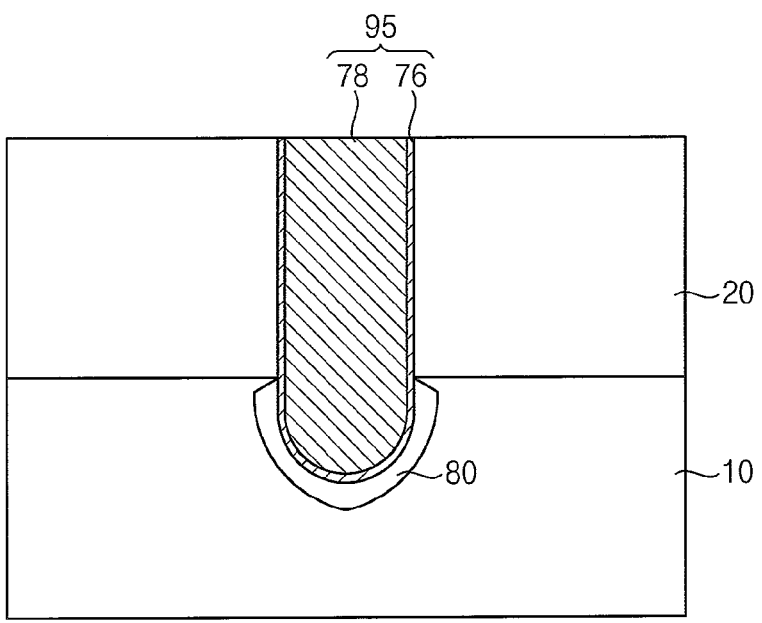

FIGS. 8 and 9 are cross-sectional views illustrating a method of manufacturing a semiconductor device including a contact plug structure in accordance with example embodiments. This method may include processes substantially the same as or similar to those illustrated with reference to FIGS. 1 to 6, and repeated explanations thereof are omitted herein.

Referring to FIG. 8, processes substantially the same as or similar to those illustrated with reference to FIGS. 1 to 5 may be performed.

However, unlike the second barrier layer 74 illustrated with reference to FIG. 5, the second barrier layer 74 may be formed to entirely fill the recess 30, and the second heat treatment process may be performed on the substrate 10 having the preliminary metal silicide layer 60 and the first and second barrier layers 72 and 74.

In an embodiment, the second heat treatment process may not be performed, however, the deposition process for forming the second barrier layer 74 may be performed at a high temperature, and may be performed for a sufficiently long time so that the second barrier layer 74 may entirely fill the recess 30, which may replace the second heat treatment process.

Referring to FIG. 9, processes substantially the same as or similar to those illustrated with reference to FIG. 6 may be performed to form the contact plug structure 95 in the recess 30.

Unlike the contact plug structure 95 as shown in FIG. 6, in an embodiment, the contact plug structure 95 may not include the second metal pattern 92, but may include only the first and second barrier patterns 76 and 78, and the second barrier pattern 78 may also serve as the second metal pattern 92.

FIGS. 10 to 46 are plan views and cross-sectional views illustrating a method of manufacturing a semiconductor device according to example embodiments. Specifically, FIGS. 10, 13, 18, 22, 29, 33 and 39 are the plan views, FIGS. 11, 14, 16, 19, 21, 23, 25, 27, 30, 34, 36 and 40 are cross-sectional views taken along lines A-A' of corresponding plan views, respectively, each of FIGS. 12, 15, 17, 20, 24, 26, 28, 31-32, 37, 41, 43 and 45 includes cross-sections taken along lines B-B' and C-C' of a corresponding plan view, and FIGS. 35, 38, 42, 44 and 46 are cross-sectional views taken along lines D-D' of corresponding plan views, respectively.

This method may be an application of the method of manufacturing the semiconductor device including the contact plug structure in accordance with example embodiments illustrated with reference to FIGS. 1 to 6 to a method of manufacturing a DRAM device. Thus, repeated explanations are omitted herein.

Hereinafter, in the specification (and not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3.

Figure 10:
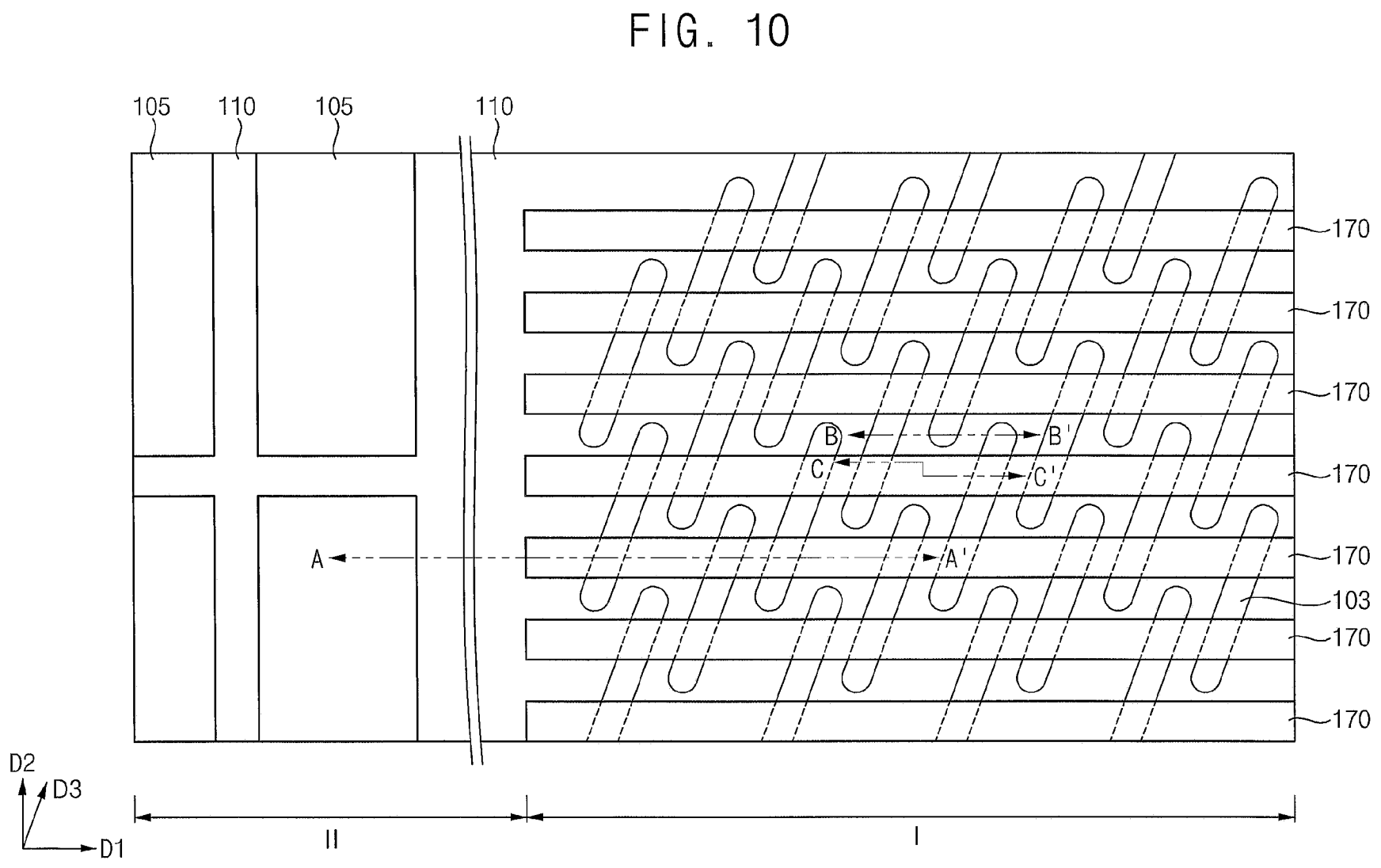
Figure 11:
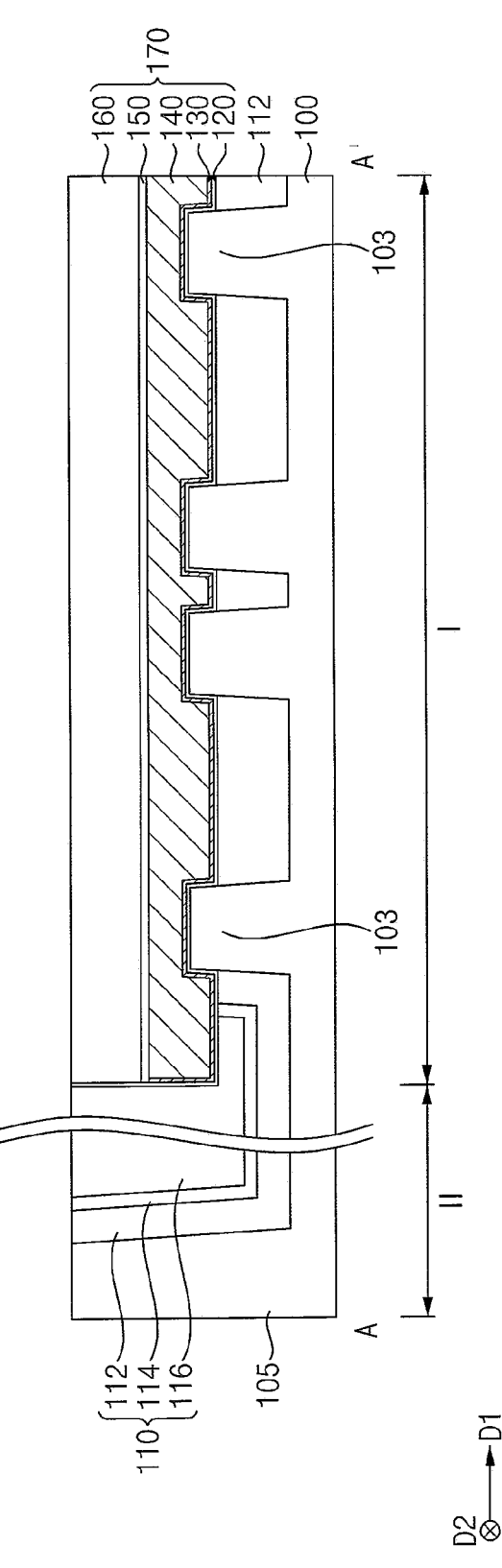
Figure 12:
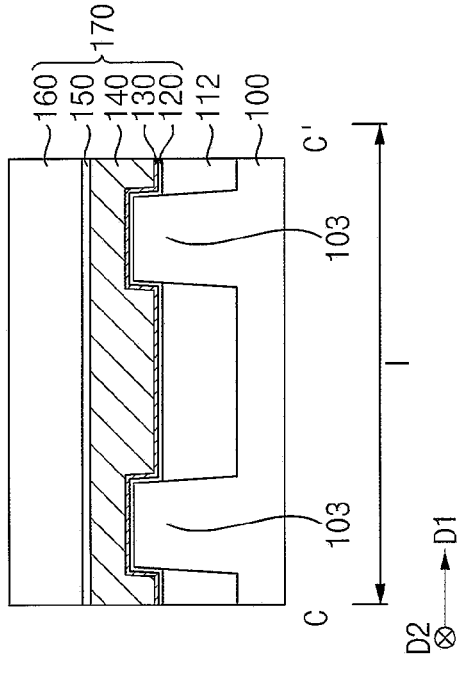
Figure 12:
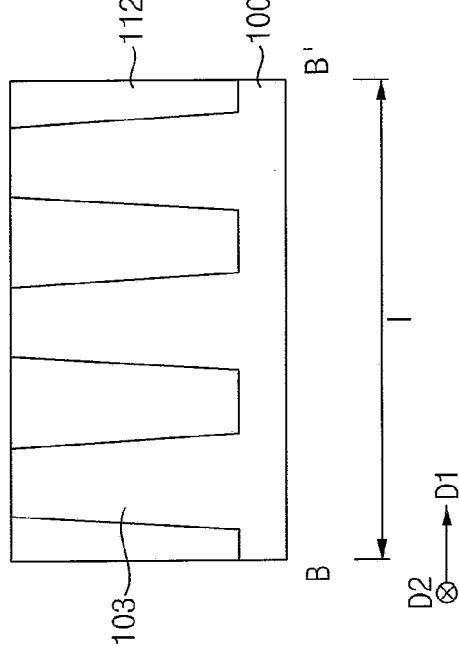

Referring to FIGS. 10 to 12, first and second active patterns 103 and 105 may be formed on the substrate 100 including first and second regions I and II, and an isolation pattern structure 110 may be formed to cover sidewalls of the first and second active patterns 103 and 105.

The substrate 100 may include or may be formed of silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The first region I of the substrate 100 may be a cell region on which memory cells are formed, and the second region II of the substrate 100 surrounding the first region I of the substrate 100 may be a peripheral circuit region on which peripheral circuit patterns for driving the memory cells are formed. FIGS. 10 to 12 show only portions of the first and second regions I and II of the substrate 100.

The first and second active patterns 103 and 105 may be formed by removing upper portions of the substrate 100 to form first recesses. The first active pattern 103 may extend in the third direction D3, and a plurality of first active patterns 103 may be spaced apart from each other in each of the first and second directions D1 and D2. Additionally, a plurality of second active patterns 105 may be spaced apart from each other in the first and second directions D1 and D2, and FIG. 1 shows some of the second active patterns 105.

In example embodiments, the isolation pattern structure 110 may include first to third isolation patterns 112, 114 and 116 sequentially stacked on an inner wall of the first recess. A portion of the first recess in the first region I of the substrate 100 may have a relatively small width, and thus only the first isolation pattern 112 may be formed in the portion of the first recess. However, a portion of the first recess in the second region II or between the first and second regions I and II of the substrate 100 may have a relatively large width, and thus the first to third isolation patterns 112, 114 and 116 may be formed in the portion of the first recess.

The first and third isolation patterns 112 and 116 may have an oxide, e.g., silicon oxide, and the second isolation pattern 114 may include or may be formed of nitride, e.g., silicon nitride.

The first active pattern 103 and the isolation pattern structure 110 in the first region I of the substrate 100 may be partially removed to form a second recess extending in the first direction D1.

A first gate structure 170 may be formed in the second recess. The first gate structure 170 may include a first gate insulation pattern 120 on a bottom and a sidewall of the second recess, a third barrier pattern 130 on a portion of the first gate insulation pattern 120 on the bottom and a lower sidewall of the second recess, a first conductive pattern 140 on the third barrier pattern 130 and filling a lower portion of the second recess, a second conductive pattern 150 on the third barrier pattern 130 and the first conductive pattern 140, and a first gate mask 160 on an upper surface of the second conductive pattern 150 and an upper inner sidewall of the first gate insulation pattern 120 and filling an upper portion of the second recess. The third barrier pattern 130, the first conductive pattern 140 and the second conductive pattern 150 may form a first gate electrode.

The first gate insulation pattern 120 may include or may be formed of oxide, e.g., silicon oxide, the third barrier pattern 130 may include or may be formed of a metal nitride, e.g., titanium nitride, tantalum nitride, etc., the first conductive pattern 140 may include or may be formed of metal, a metal nitride, a metal silicide, doped polysilicon, etc., the second conductive pattern 150 may include or may be formed of doped polysilicon, and the first gate mask 160 may include or may be formed of nitride, e.g., silicon nitride.

In an embodiment, the first gate structure 170 may not include the third barrier pattern 130, but may include the first gate insulation pattern 120, the first conductive pattern 140, the second conductive pattern 150 and the first gate mask 160. In this case, the first conductive pattern 140 may include or may be formed of metal nitride, e.g., titanium nitride.

In example embodiments, the first gate structure 170 may extend in the first direction D1 on the first region I of the substrate 100, and a plurality of first gate structures 170 may be spaced apart from each other in the second direction D2. End portions in the first direction D1 of the first gate structures 170 may be aligned with each other in the second direction D2.

Figure 13:
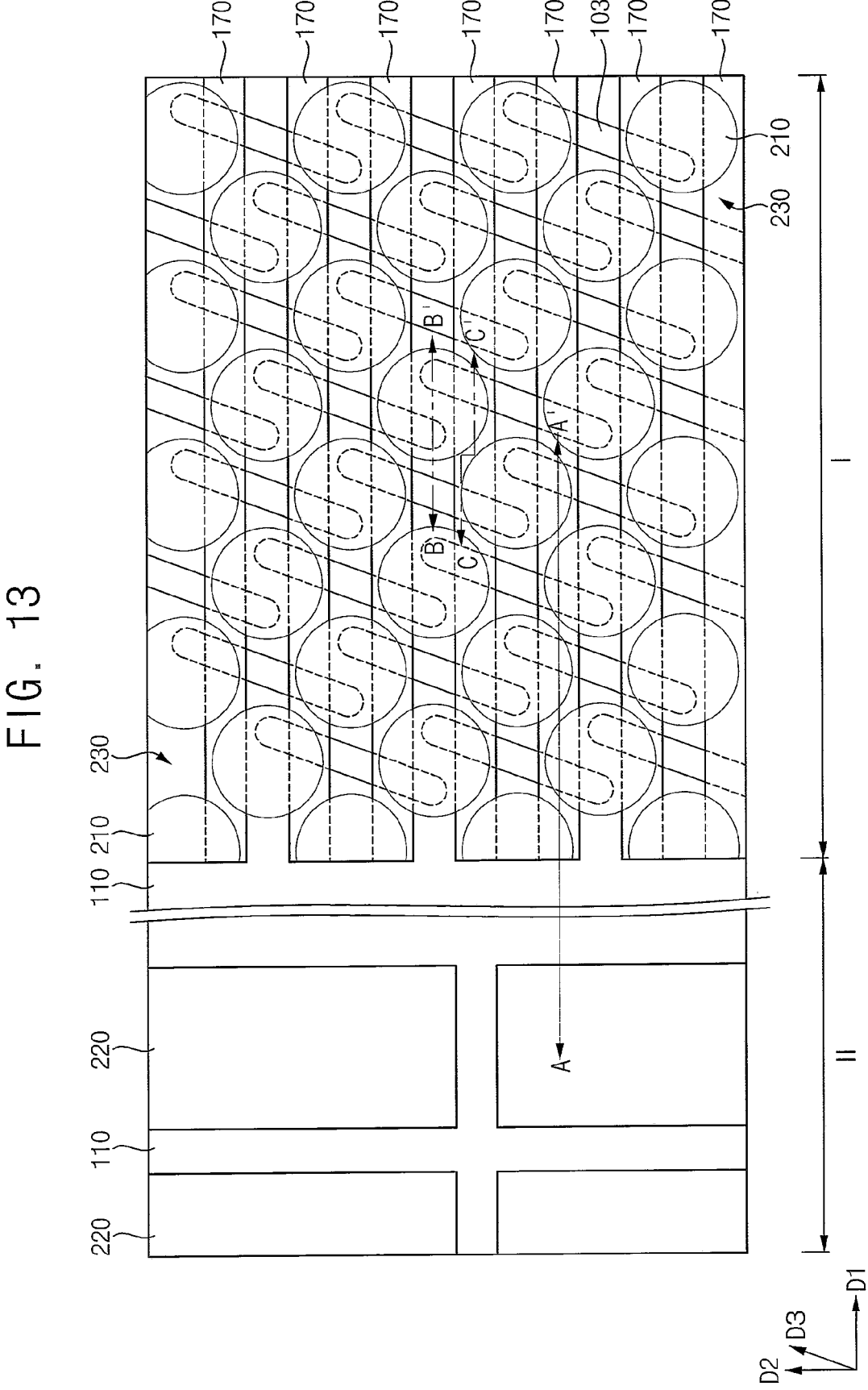
Figure 14:
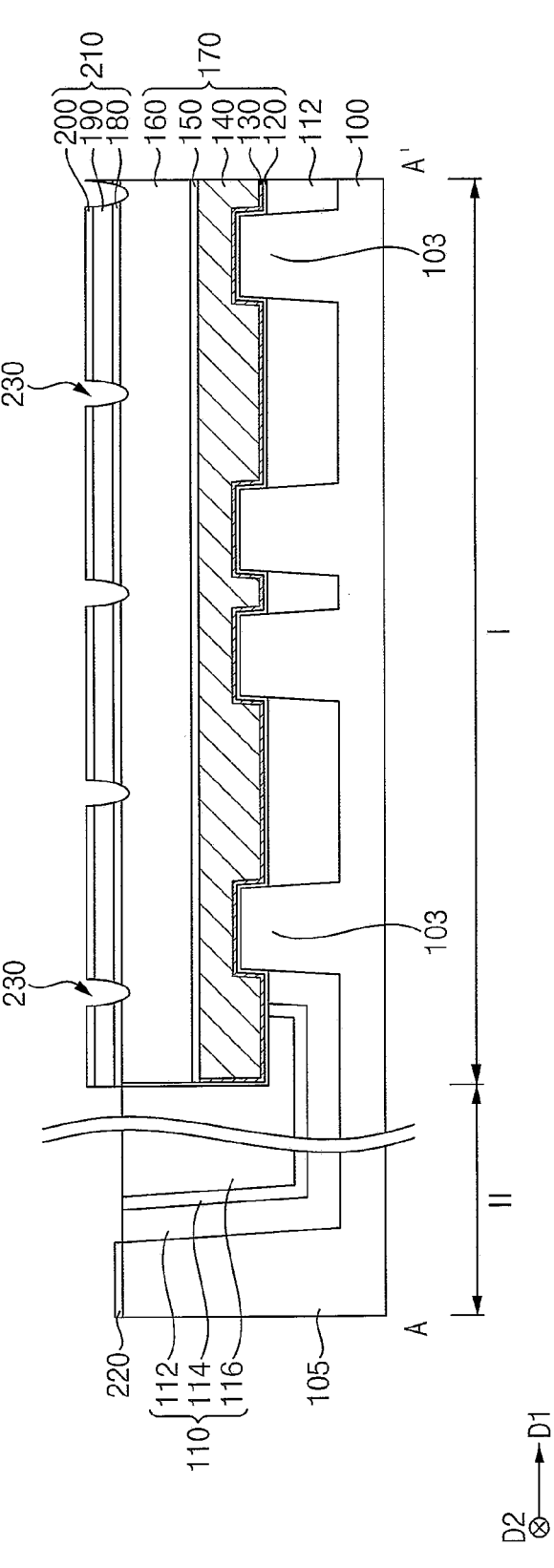
Figure 15:
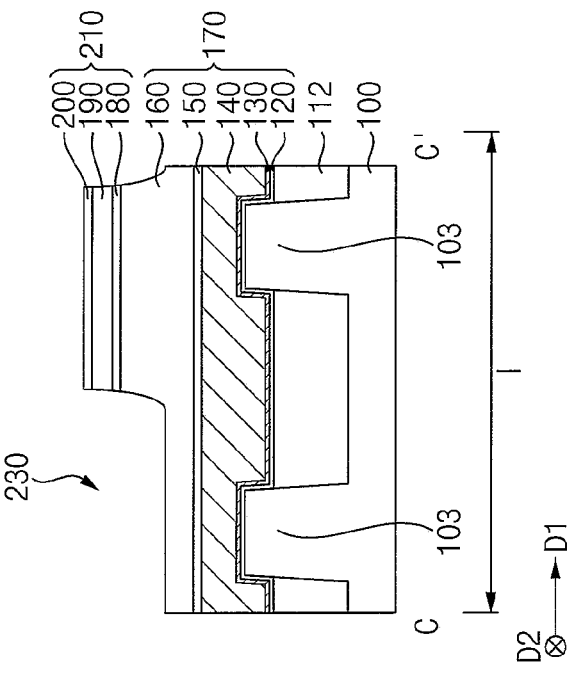
Figure 15:
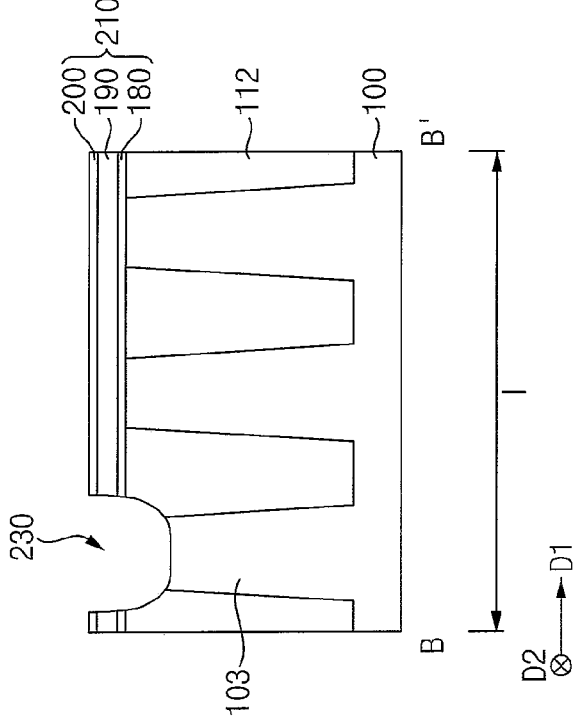

Referring to FIGS. 13 to 15, an insulation layer structure 210 may be formed on the first and second regions I and II of the substrate 100, a portion of the insulation layer structure 210 on the second region II of the substrate 100 may be removed, and, e.g., a thermal oxidation process may be performed on the second active pattern 105 on the second region II of the substrate 100 to form a second gate insulation layer 220.

The insulation layer structure 210 may include first to third insulation layers 180, 190 and 200 sequentially stacked on each other. The first and third insulation layers 180 and 200 may include or may be formed of oxide, e.g., silicon oxide, and the second insulation layer 190 may include or may be formed of nitride, e.g., silicon nitride.

In an embodiment, the second and third insulation layers 190 and 200 on the second region II of the substrate 100 among the insulation layer structure 210 may be removed, and the first insulation layer 180 remaining on the second region II of the substrate 100 may serve as a second gate insulation layer 220. In this case, the second gate insulation layer 220 may be formed on the second region II of the substrate 100. For example, the second gate insulation layer 220 may be formed on the second active pattern 105 in the second region II of the substrate 100 and the isolation pattern structure 110 on the second region II of the substrate 100.

The insulation layer structure 210 may be patterned, and the first active pattern 103, the isolation pattern structure 110, and the first gate mask 160 of the first gate structure 170 may be partially etched using the patterned insulation layer structure 210 as an etching mask to form a first opening 230. In example embodiments, the patterned insulation layer structure 210 may have a shape of a circle or an ellipse when viewed in a plan view, and a plurality of insulation layer structures 210 may be spaced apart from each other in the first and second directions D1 and D2 on the first region I of the substrate 100. Each of the insulation layer structures 210 may overlap opposite end portions in the third direction D3 of the first active patterns 103 in a vertical direction substantially perpendicular to the upper surface of the substrate 100.

Figure 16:
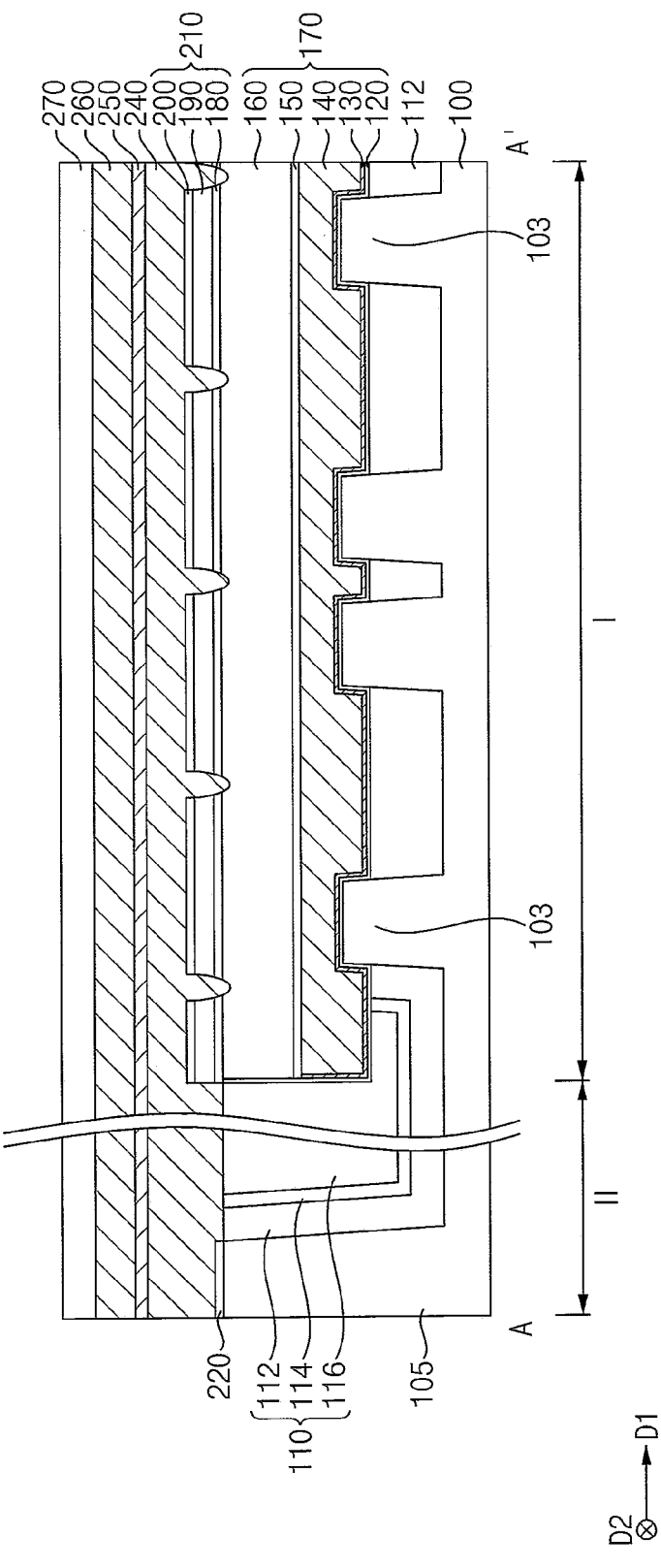
Figure 17:
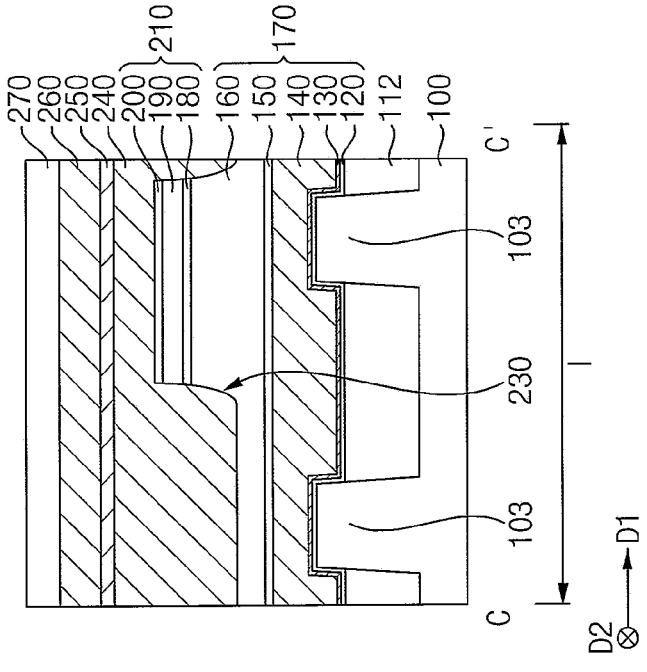
Figure 17:
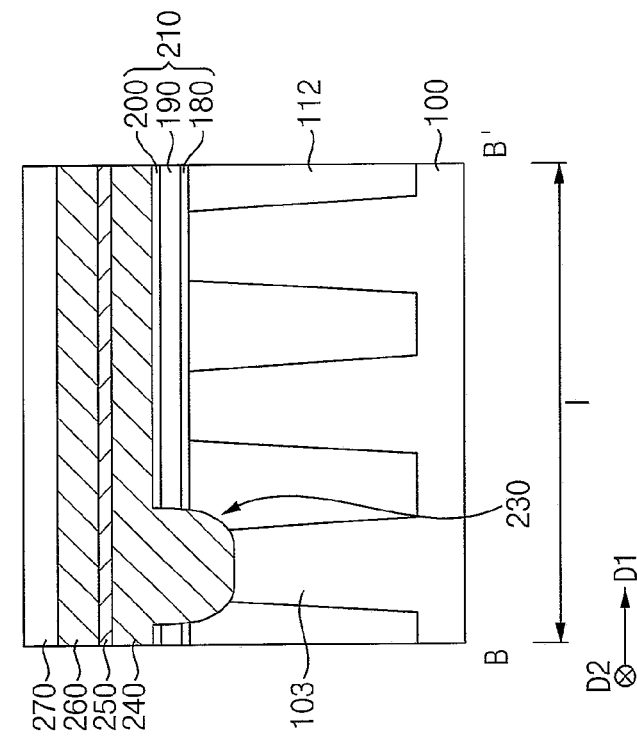

Referring to FIGS. 16 and 17, a third conductive layer 240, a fourth barrier layer 250, a fourth conductive layer 260, and a first mask layer 270 may be sequentially stacked on the first and second regions I and II of the substrate 100. For example, a stacked structure of the third conductive layer 240, the fourth barrier layer 250, the fourth conductive layer 260, and a first mask layer 270 may be formed on the insulation layer structure 210, the first active pattern 103, the isolation pattern structure 110 and the first gate structure 170 exposed by the first opening 230 that are formed on the first region I of the substrate 100. The stacked structure may be formed on the second gate insulation layer 220 and the isolation pattern structure 110 that are formed on the second region II of the substrate 100. The stacked structure of the third conductive layer 240, the fourth barrier layer 250, the fourth conductive layer 260, and a first mask layer 270 may form a conductive structure layer. The third conductive layer 240 may fill the first opening 230.

The third conductive layer 240 may include or may be formed of doped polysilicon, the fourth barrier layer 250 may include or may be formed of a metal silicon nitride, e.g., titanium silicon nitride, the fourth conductive layer 260 may include or may be formed of metal, e.g., tungsten, and the first mask layer 270 may include or may be formed of nitride, e.g., silicon nitride.

Figure 18:
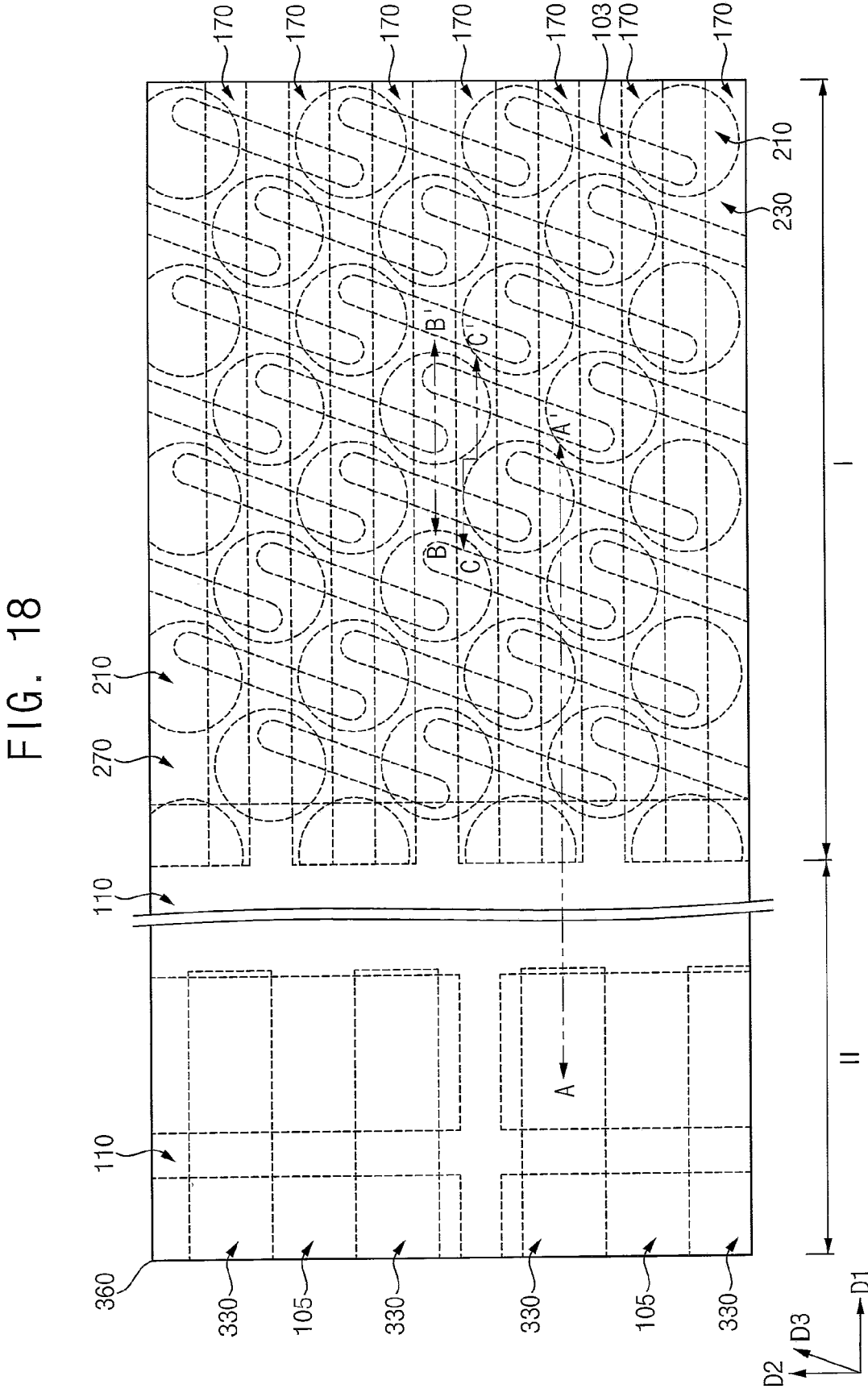
Figure 19:
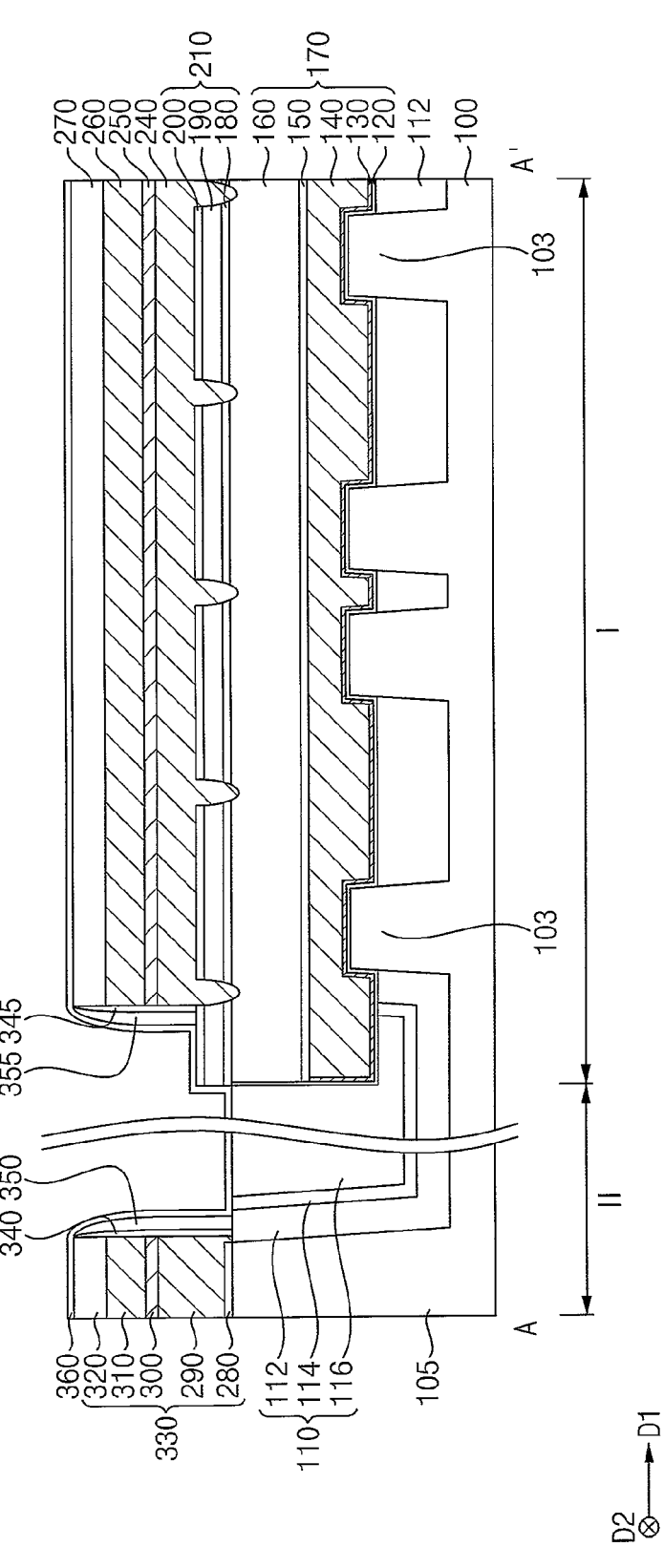
Figure 20:
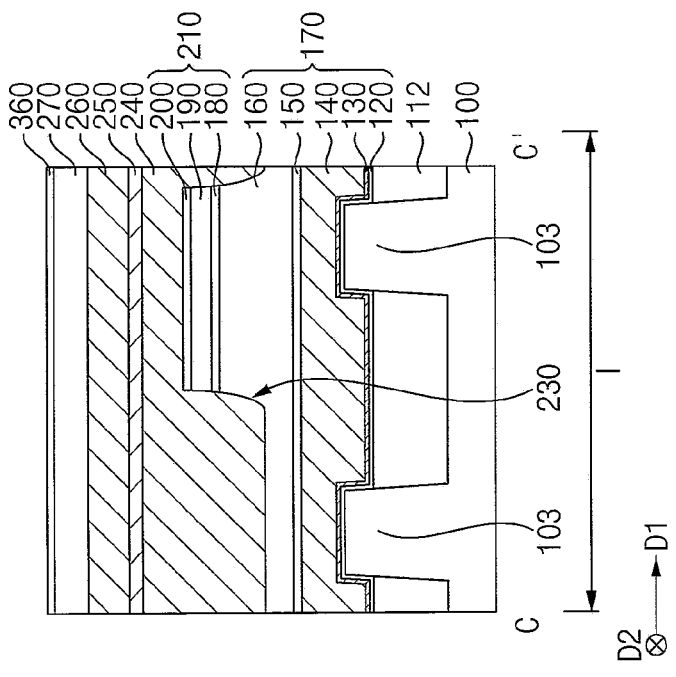
Figure 20:
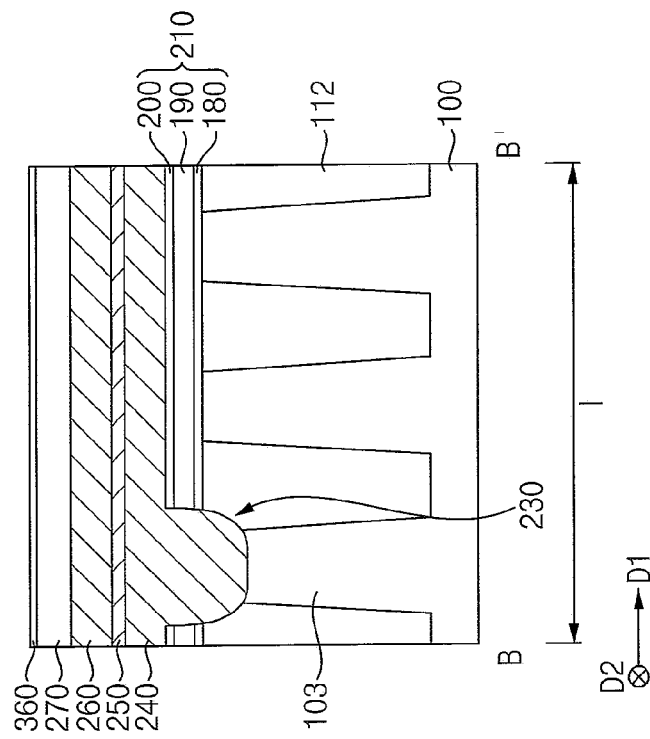

Referring to FIGS. 18 to 20, the conductive structure layer and the second gate insulation layer 220 may be patterned to form a second gate structure 330 on the second region II of the substrate 100.

The second gate structure 330 may include a second gate insulation pattern 280, a fifth conductive pattern 290, a fifth barrier pattern 300, a sixth conductive pattern 310, and a second gate mask 320 sequentially stacked in a vertical direction substantially perpendicular to an upper surface of the substrate 100. The fifth conductive pattern 290, the fifth barrier pattern 300 and the sixth conductive pattern 310 may form a second gate electrode.

The second gate structure 330 may partially overlap the second active pattern 105 in the vertical direction on the second region II of the substrate 100. FIG. 18 shows 4 second gate structures 330 spaced apart from each other in the second direction D2. Each second gate structure of the 4 second gate structures 330 may extend in the first direction D1. The inventive concept, however, may not be limited thereto.

A portion of the conductive structure layer on an edge portion of the first region I of the substrate 100 adjacent to the second region II of the substrate 100 may also be removed, and thus the insulation layer structure 210, and upper surfaces of the first active pattern 103, the isolation pattern structure 110, and the first gate structure 170 exposed by the first opening 230 may also be partially exposed.

A first spacer structure may be formed on a sidewall of the second gate structure 330, and a second spacer structure may be formed on a sidewall of the conductive structure layer remaining on the first region I of the substrate 100. The first spacer structure may include first and third spacers 340 and 350 stacked on the sidewall of the second gate structure 330 in a horizontal direction substantially parallel to the upper surface of the substrate 100, and the second spacer structure may include second and fourth spacers 345 and 355 stacked on the sidewall of the conductive structure layer in the horizontal direction.

The first and second spacers 340 and 345 may be formed by forming a first spacer layer on the substrate 100 to cover the conductive structure layer and the second gate structure 330 and anisotropically etching the first spacer layer. The third and fourth spacers 350 and 355 may be formed by forming a second spacer layer on the substrate 100 to cover the conductive structure layer, the second gate structure 330 and the first and second spacers 340 and 345 and anisotropically etching the second spacer layer.

The first and second spacers 340 and 345 may include or may be formed of nitride, e.g., silicon nitride, and the third and fourth spacers 350 and 355 may include or may be formed of oxide, e.g., silicon oxide.

However, the structure of the first and second spacer structures may not be limited thereto, and each of the first and second spacer structures may include a single spacer or more than two spacers sequentially stacked on each other.

In example embodiments, impurities may be implanted or doped into upper portions of the second active pattern 105 adjacent to the second gate structure 330 to form source/drain layers, and the second gate structure 330 and the source/drain layers may form a transistor.

A first etch stop layer 360 may be formed on the substrate 100 to cover the conductive structure layer, the second gate structure 330, the first and second spacer structures, and the isolation pattern structure 110. The first etch stop layer 360 may include or may be formed of nitride, e.g., silicon nitride.

Figure 21:
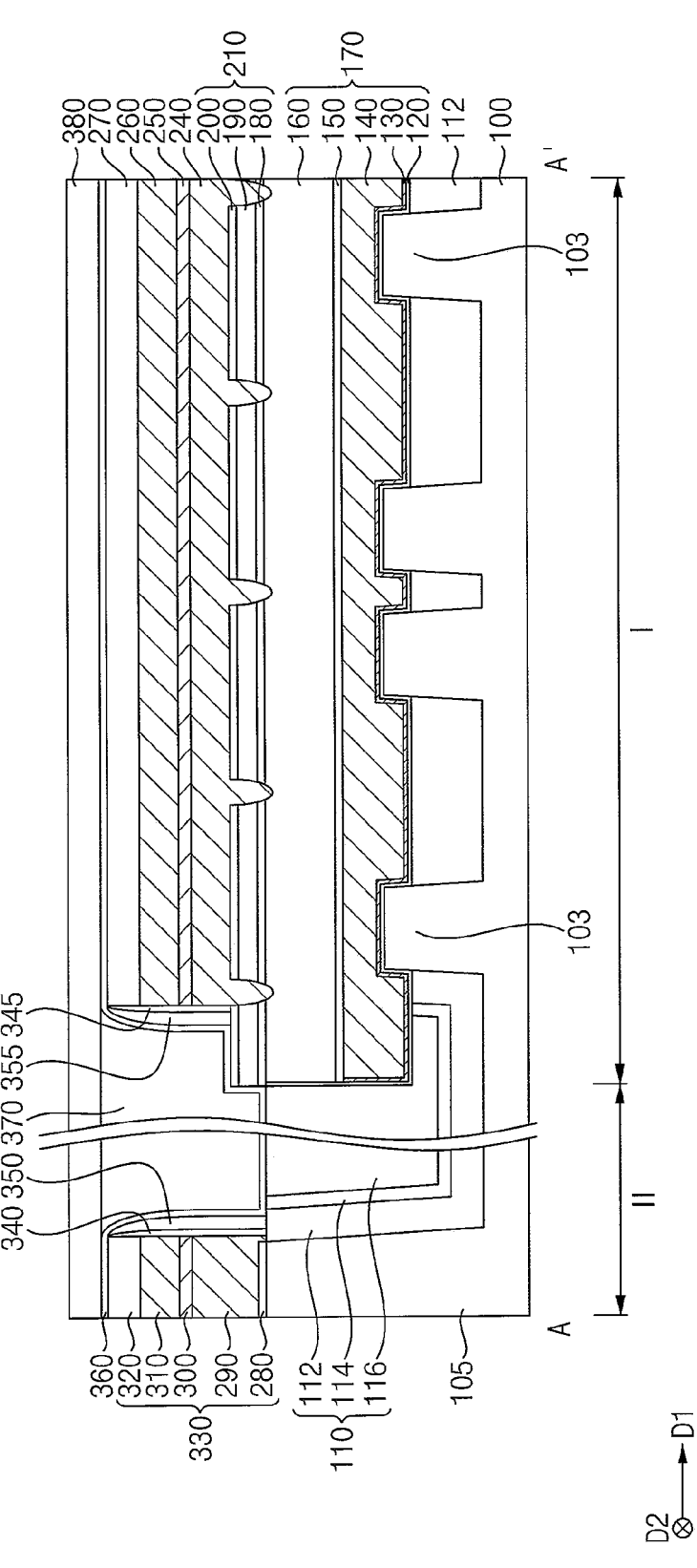

Referring to FIG. 21, a second insulating interlayer 370 may be formed on the first etch stop layer 360 to a sufficient height, and may be planarized to expose an upper surface of the second gate structure 330 and an upper surface of a portion of the first etch stop layer 360 on the conductive structure layer. A second capping layer 380 may be formed on the second insulating interlayer 370 and the first etch stop layer 360.

Thus, the second insulating interlayer 370 may fill a space between the first spacer structures on the sidewall of the second gate structures 330, and a space between the first spacer structure on the sidewall of the second gate structure 330 and the second spacer structure on the sidewall of the conductive structure layer.

The second insulating interlayer 370 may include or may be formed of oxide, e.g., silicon oxide, and the second capping layer 380 may include or may be formed of nitride, e.g., silicon nitride.

Figure 22:
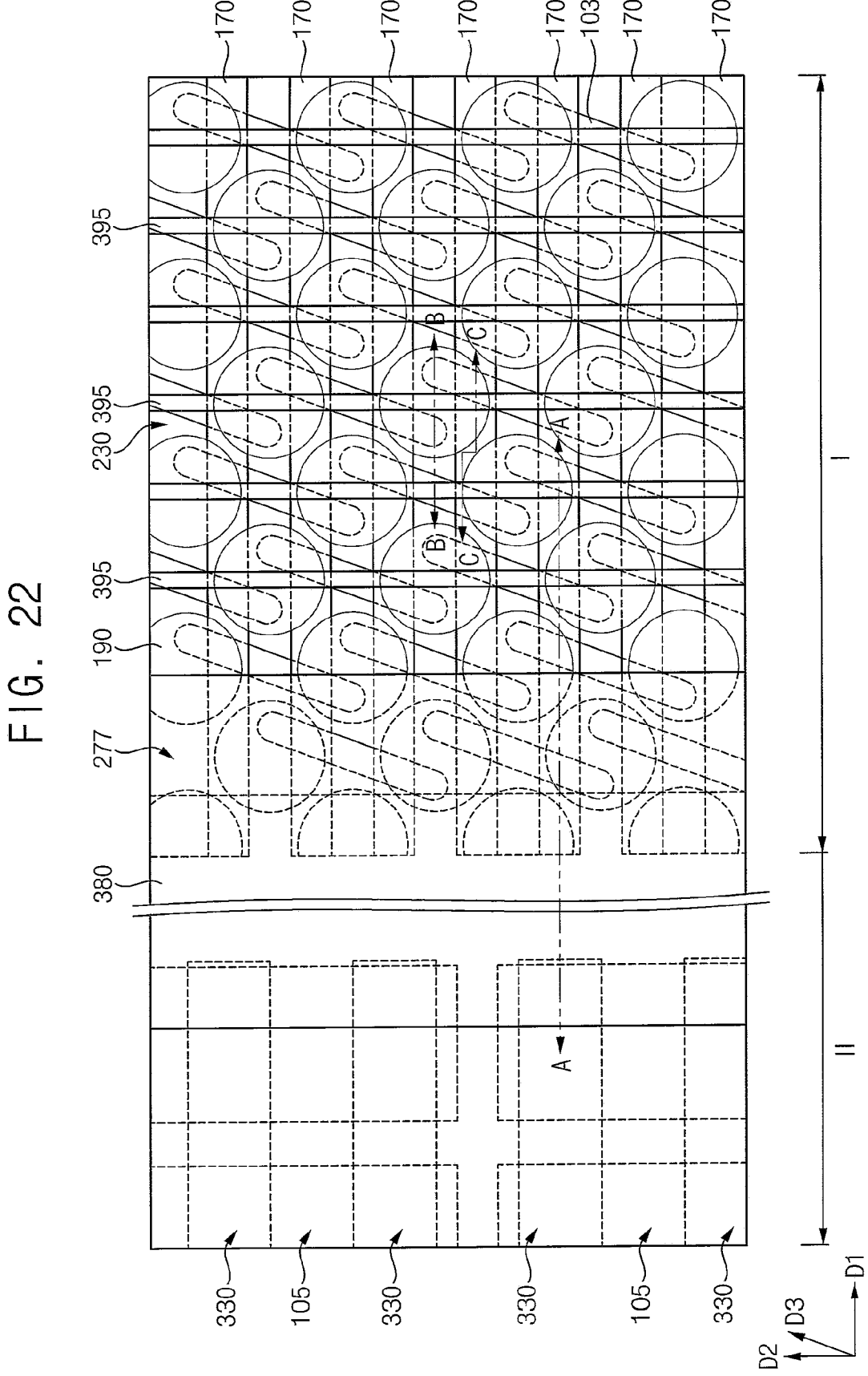
Figure 23:
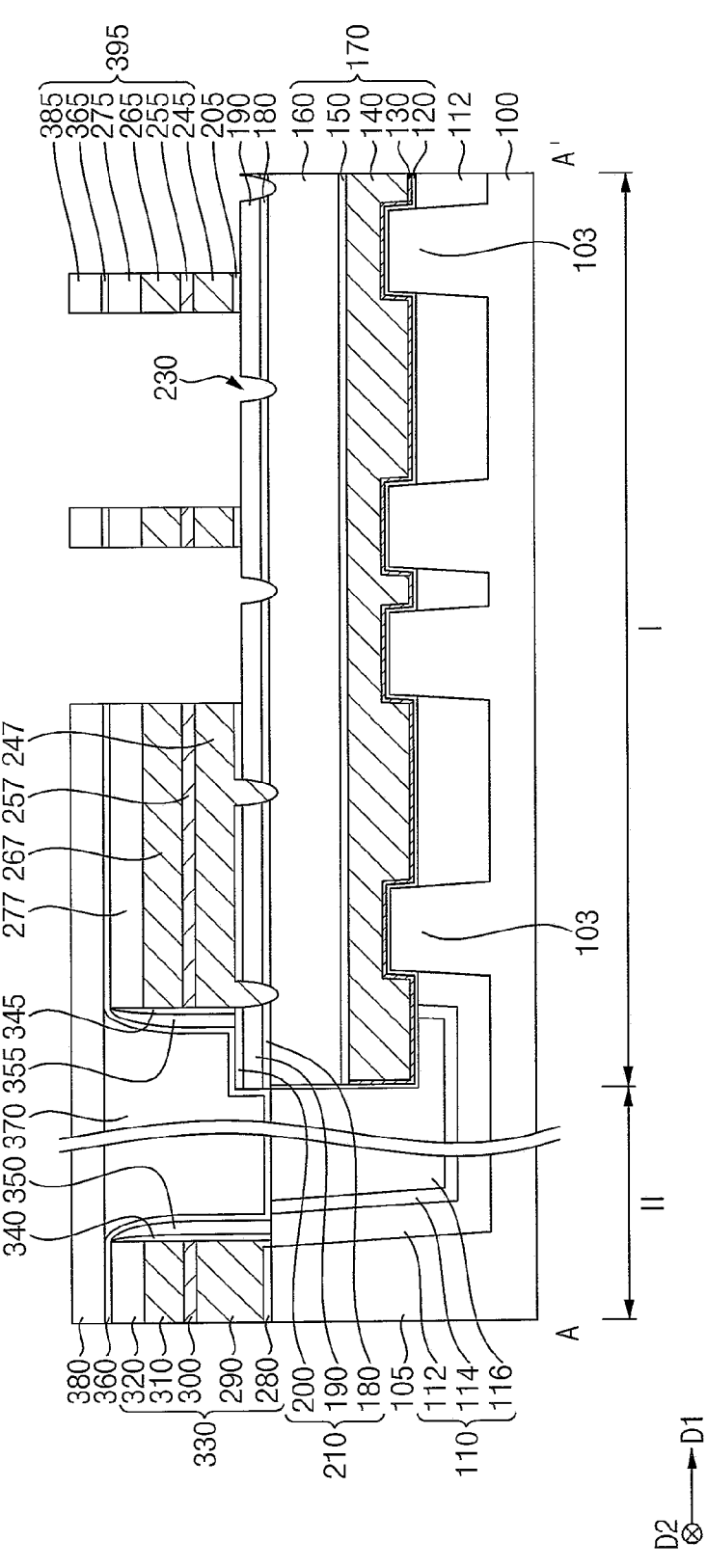
Figure 24:
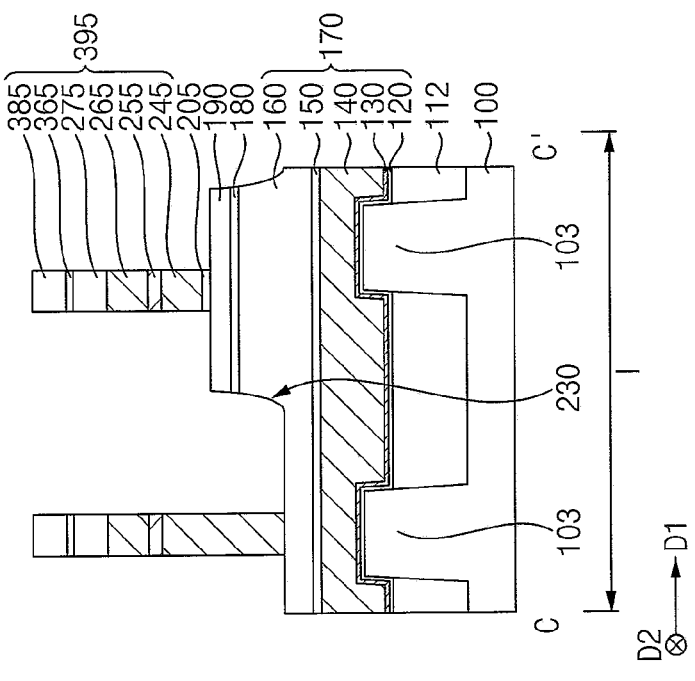
Figure 24:
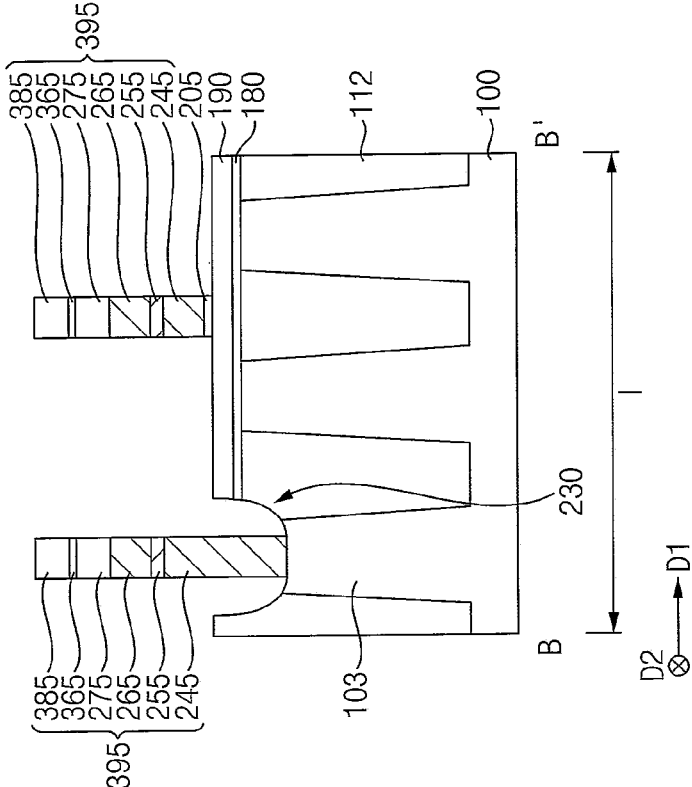

Referring to FIGS. 22 to 24, a portion of the second capping layer 380 on the first region I of the substrate 100 may be etched to form a second capping pattern 385. The first etch stop layer 360, the first mask layer 270, the fourth conductive layer 260, the fourth barrier layer 250 and the third conductive layer 240 may be sequentially etched using the second capping pattern 385 as an etching mask.

In example embodiments, the second capping pattern 385 may extend in the second direction D2 on the first region I of the substrate 100, and a plurality of second capping patterns 385 may be formed to be spaced apart from each other in the first direction D1. The second capping layer 380 may remain on the second region II of the substrate 100.

By the etching process, on the first region I of the substrate 100, a third conductive pattern 245, a fourth barrier pattern 255, a fourth conductive pattern 265, a first mask 275, a first etch stop pattern 365, and the second capping pattern 385 may be sequentially stacked on the first opening 230, and a third insulation pattern 205, the third conductive pattern 245, the fourth barrier pattern 255, the fourth conductive pattern 265, the first mask 275, the first etch stop pattern 365 and the second capping pattern 385 may be sequentially stacked on the second insulation layer 190 of the insulation layer structure 210 at an outside of the first opening 230.

Hereinafter, the third conductive pattern 245, the fourth barrier pattern 255, the fourth conductive pattern 265, the first mask 275, the first etch stop pattern 365, and the second capping pattern 385 sequentially stacked may be referred to as a bit line structure 395. In example embodiments, the bit line structure 395 may extend in the second direction D2 on the first region I of the substrate 100, and a plurality of bit line structures 395 may be spaced apart from each other in the first direction D1.

A dummy bit line structure including a seventh conductive pattern 247, a sixth barrier pattern 257, an eighth conductive pattern 267, and a second mask 277 sequentially stacked on each other and extending in the second direction D2 may be formed on a portion of the first region I of the substrate 100 adjacent to the second region II of the substrate 100 in the first direction D1. The first etch stop layer 360 may remain on the second gate structure 330, the dummy bit line structure, the first and second spacer structures, a portion of the insulation layer structure 210, and the isolation pattern structure 110. The second capping layer 380 may remain on portions of the first etch stop layer 360, and upper surfaces of the second gate structure 330, the dummy bit line structure, and the second insulating interlayer 370.

Figure 25:
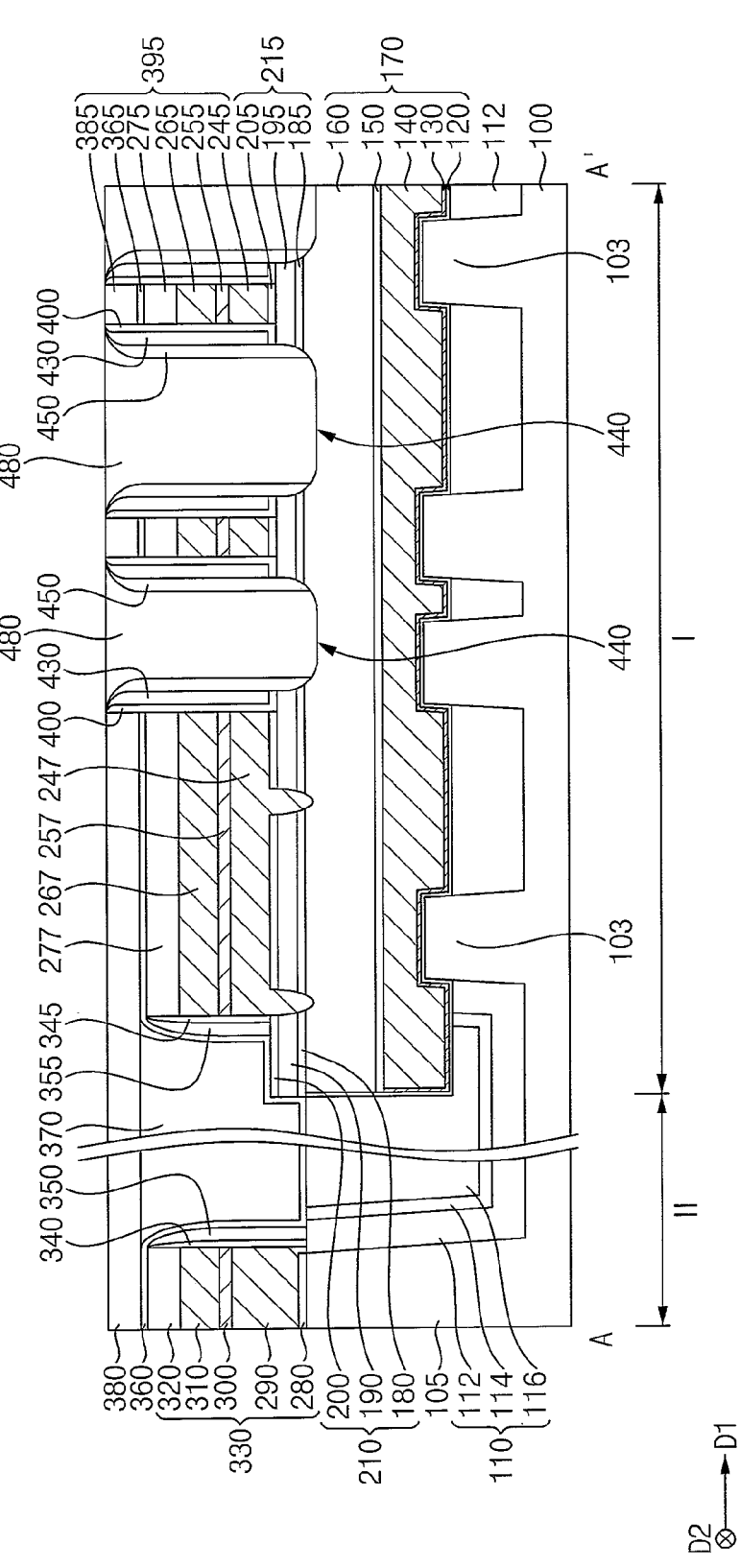
Figure 26:
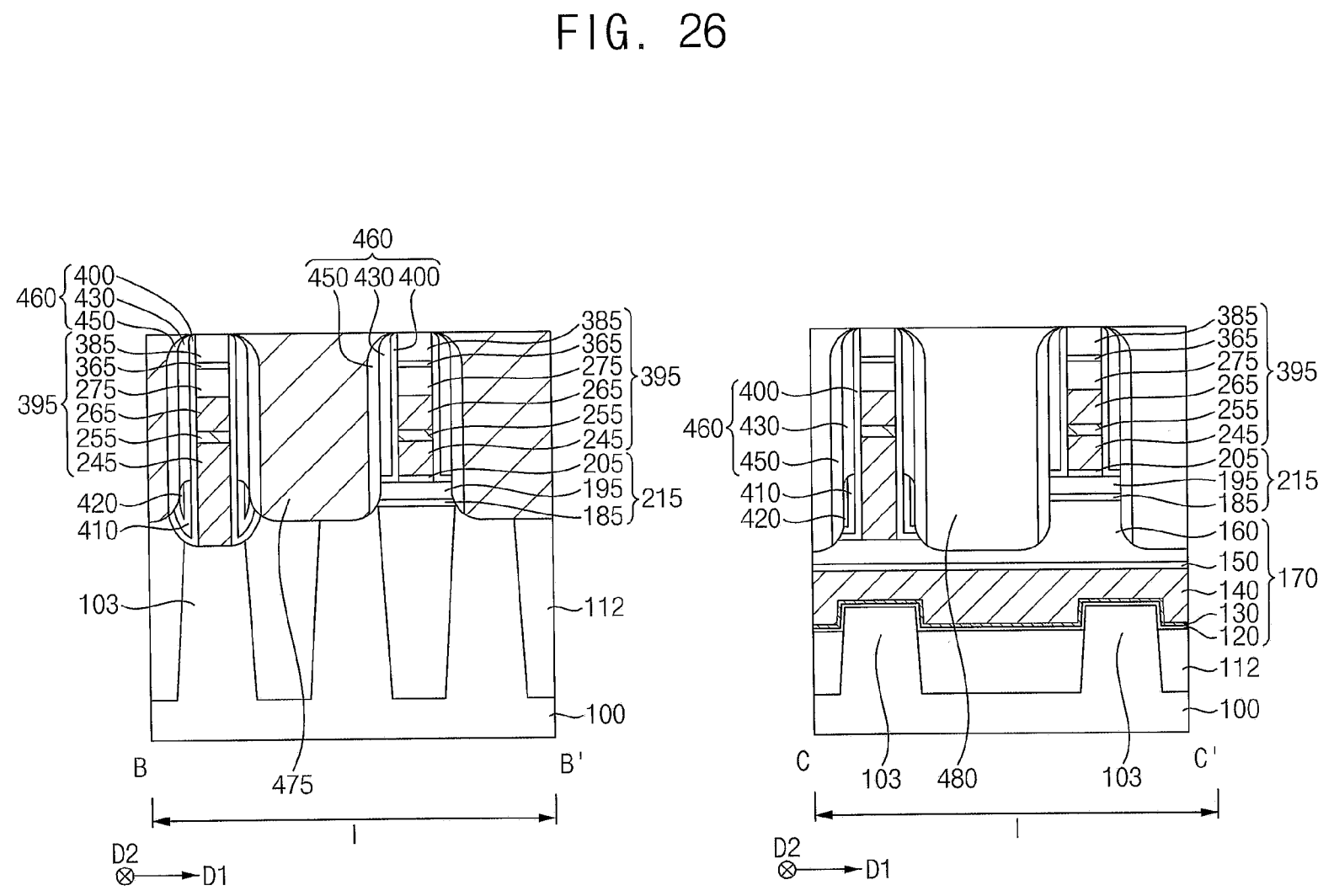

Referring to FIGS. 25 and 26, a fifth spacer layer may be formed on the substrate 100 to cover the bit line structure 395, the dummy bit line structure, and the second capping layer 380, and fourth and fifth insulation layers may be sequentially formed on the fifth spacer layer.

The fifth spacer layer may also cover a sidewall of the third insulation pattern 205 between the second insulation layer 190 and the bit line structure 395, and the fifth insulation layer may fill the first opening 230.

The fifth spacer layer may include or may be formed of nitride, e.g., silicon nitride, the fourth insulation layer may include or may be formed of oxide, e.g., silicon oxide, and the fifth insulation layer may include or may be formed of nitride, e.g., silicon nitride.

The fourth and fifth insulation layers may be etched by an etching process. In example embodiments, the etching process may be performed by a wet etch process using an etching solution including phosphorous acid ($H_3PO_4$), SC1, or hydrogen fluoride (HF), and other portions of the fourth and fifth insulation layers except for a portion in the first opening 230 may be removed. Thus, most of an entire surface of the fifth spacer layer, that is, an entire surface except for a portion thereof in the first opening 230 may be exposed, and portions of the fourth and fifth insulation layers remaining in the first opening 230 may form fourth and fifth insulation patterns 410 and 420, respectively.

A sixth spacer layer may be formed on the exposed surface of the fifth spacer layer and the fourth and fifth insulation patterns 410 and 420 in the first opening 230, and may be anisotropically etched to form a sixth spacer 430 on the surface of the fifth spacer layer and the fourth and fifth insulation patterns 410 and 420 to cover a sidewall of the bit line structure 395. The sixth spacer layer may also be formed on a sidewall of the dummy bit line structure. The sixth spacer layer may include or may be formed of oxide, e.g., silicon oxide.

A dry etching process may be performed using the second capping pattern 385 and the sixth spacer 430 as an etching mask to form a second opening 440 exposing the upper surface of the first active pattern 103. An upper surface of the first isolation pattern 112 of the isolation pattern structure 110 and an upper surface of the first gate mask 160 may also be exposed by the second opening 440.

By the dry etching process, portions of the fifth spacer layer on upper surfaces of the second capping pattern 385, the second insulation layer 190, and the second capping layer 380 may be removed, and thus a fifth spacer 400 covering the sidewall of the bit line structure 395 may be formed. The fifth spacer 400 may also cover the sidewall of the dummy bit line structure.

During the dry etching process, the first and second insulation layers 180 and 190 may be partially removed, and first and second insulation patterns 185 and 195 may remain under the bit line structure 395. The first to third insulation patterns 185, 195 and 205 that are sequentially stacked under the bit line structure 395 may form an insulation pattern structure 215.

Figure 27:
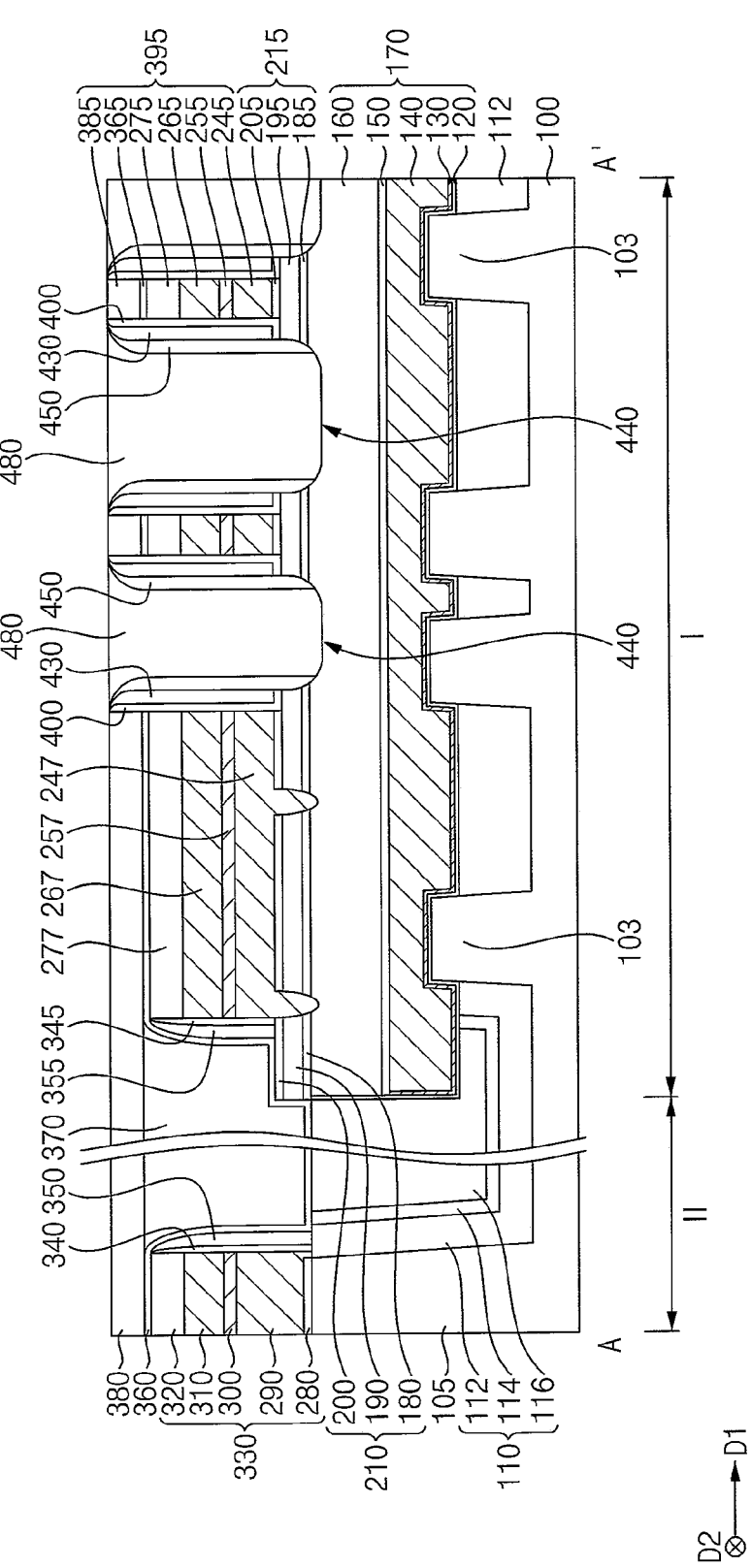
Figure 28:
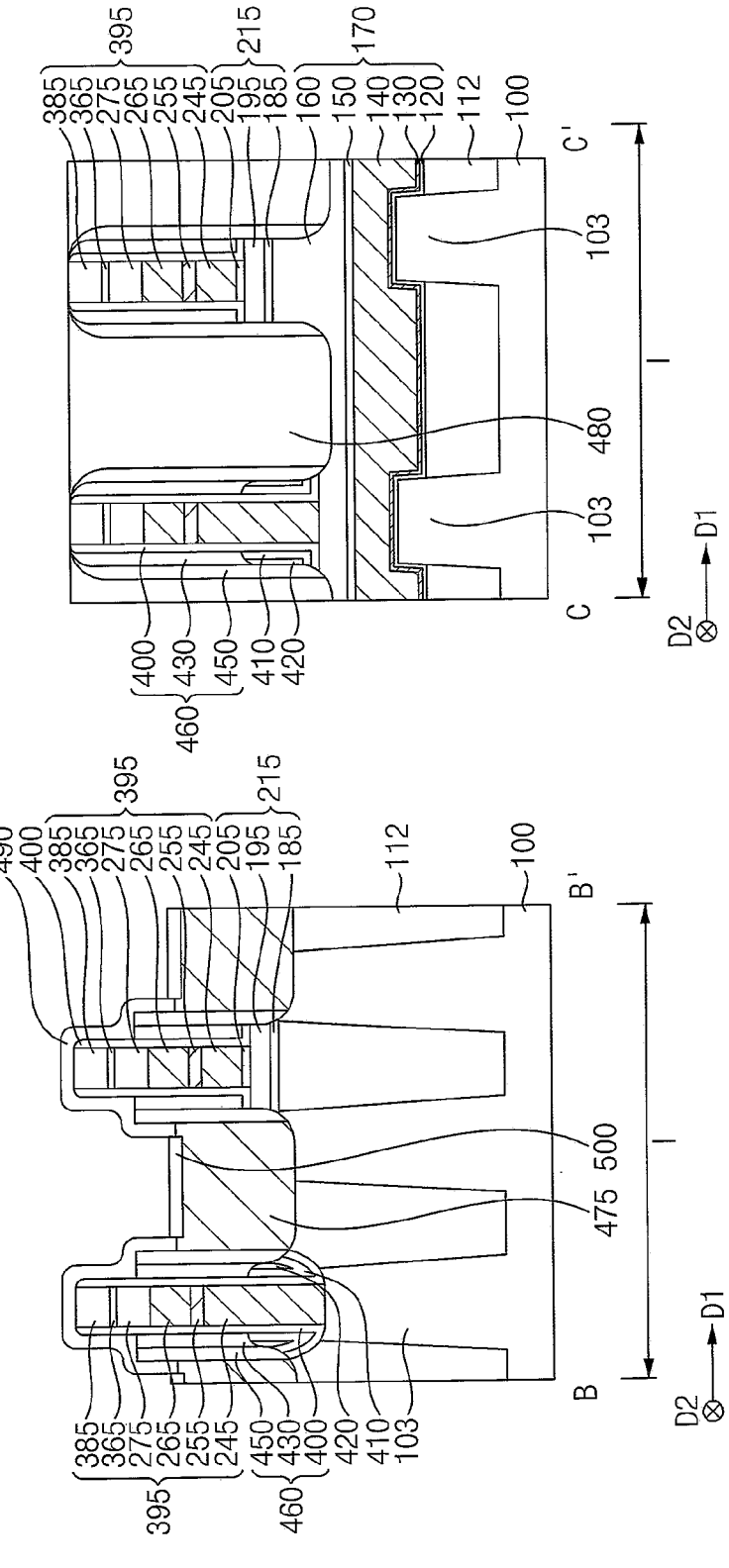

Referring to FIGS. 27 and 28, a seventh spacer layer may be formed on the upper surface of the second capping pattern 385, the upper surface of the second capping layer 380, an outer sidewall of the sixth spacer 430, portions of upper surfaces of the fourth and fifth insulation patterns 410 and 420, and the upper surfaces of the first active pattern 103, the first isolation pattern 112, and the first gate mask 160 exposed by the second opening 440, and may be anisotropically etched to form a seventh spacer 450 covering the sidewall of the bit line structure 395. The seventh spacer layer may include or may be formed of nitride, e.g., silicon nitride.

The fifth to seventh spacers 400, 430 and 450 sequentially stacked in the horizontal direction from the sidewall of the bit line structure 395 on the first region I of the substrate 100 may be referred to as a third spacer structure 460.

A lower contact plug layer may be formed on the first region I of the substrate 100 to fill the second opening 440, and may be planarized to expose the upper surfaces of the second capping pattern 385 and the second capping layer 380.

In example embodiments, the lower contact plug layer may extend in the second direction D2, and a plurality of lower contact plug layers may be spaced apart from each other in the first direction D1 by the bit line structures 395. The lower contact plug layer may include or may be formed of, e.g., doped polysilicon.

Figure 29:
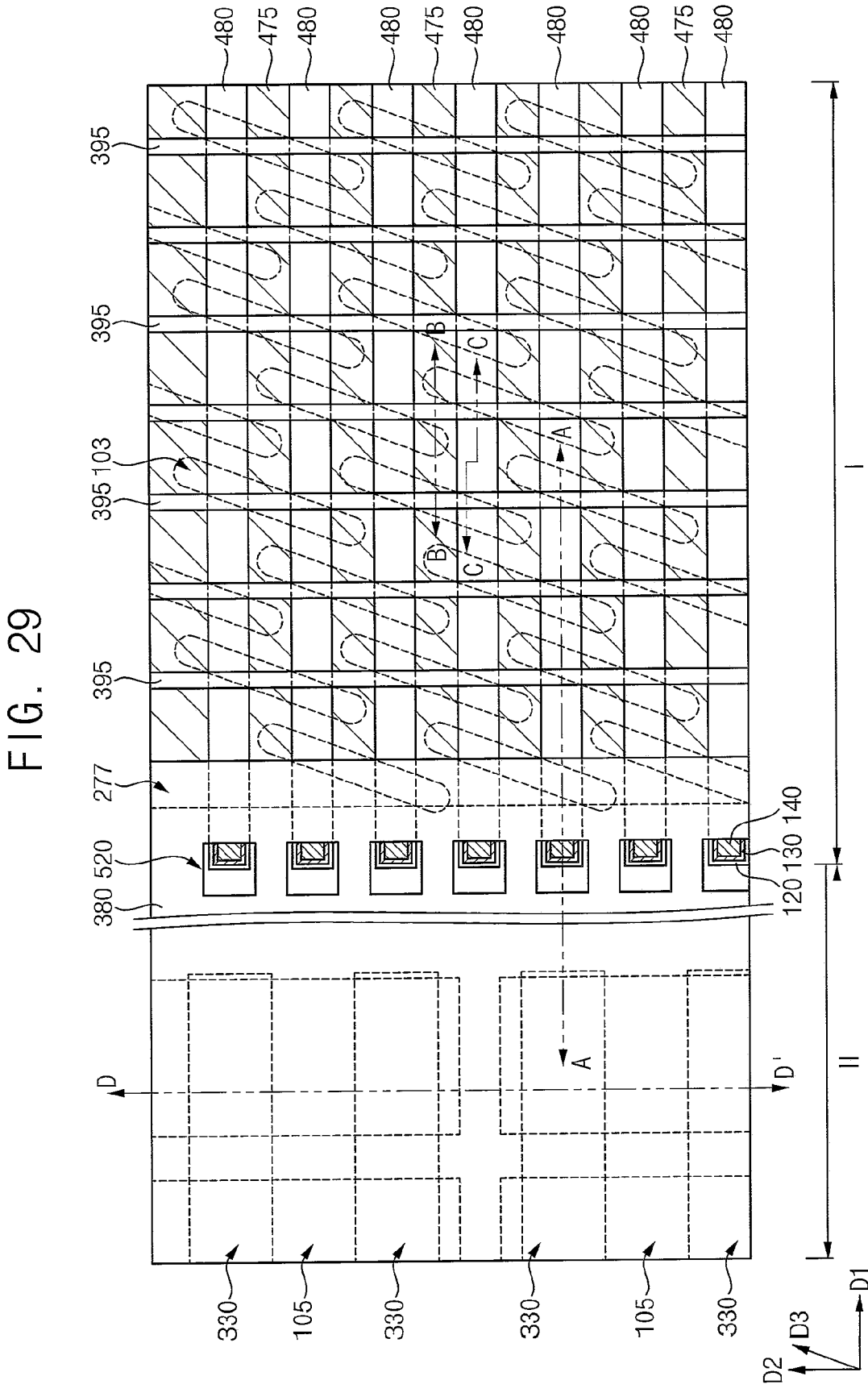
Figure 30:
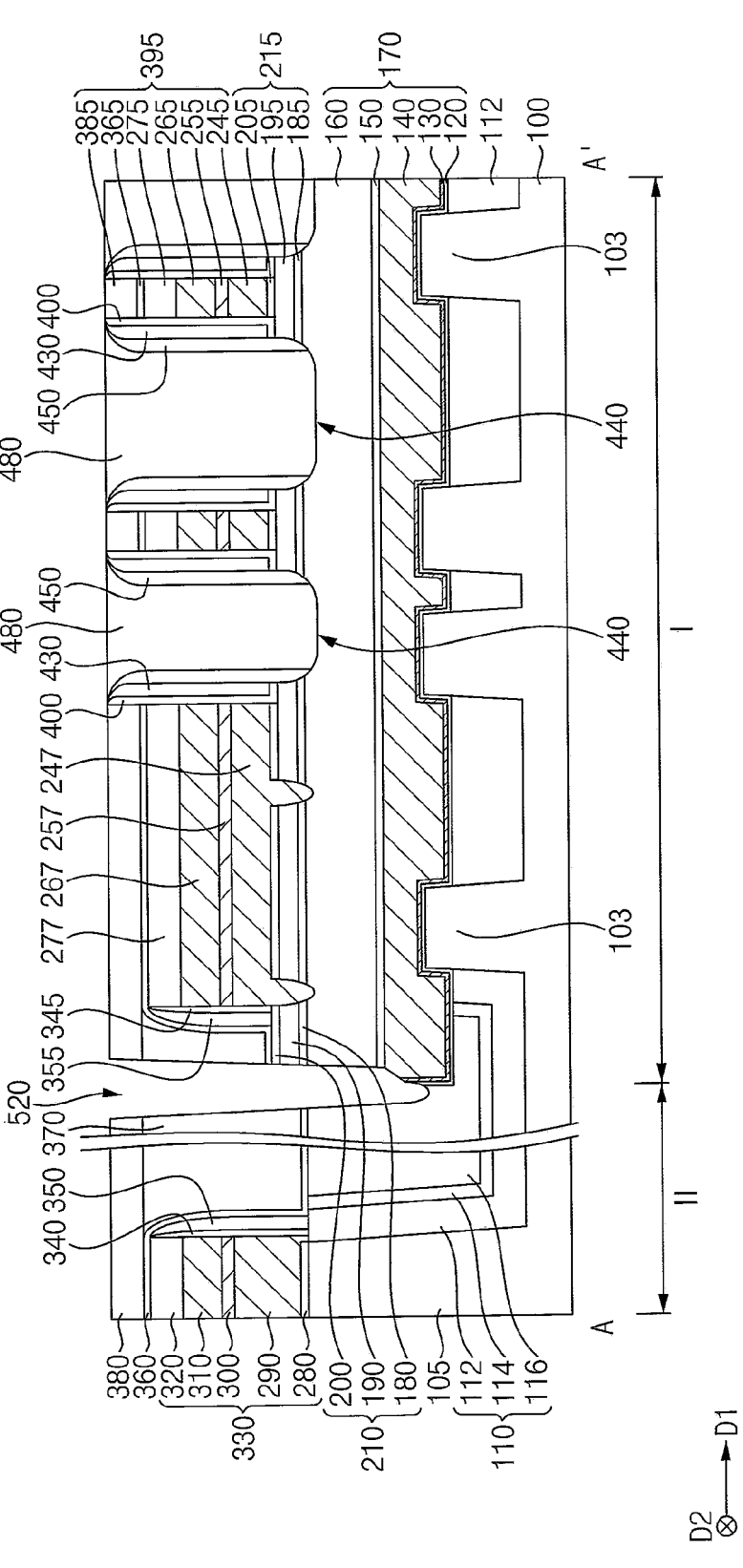
Figure 31:
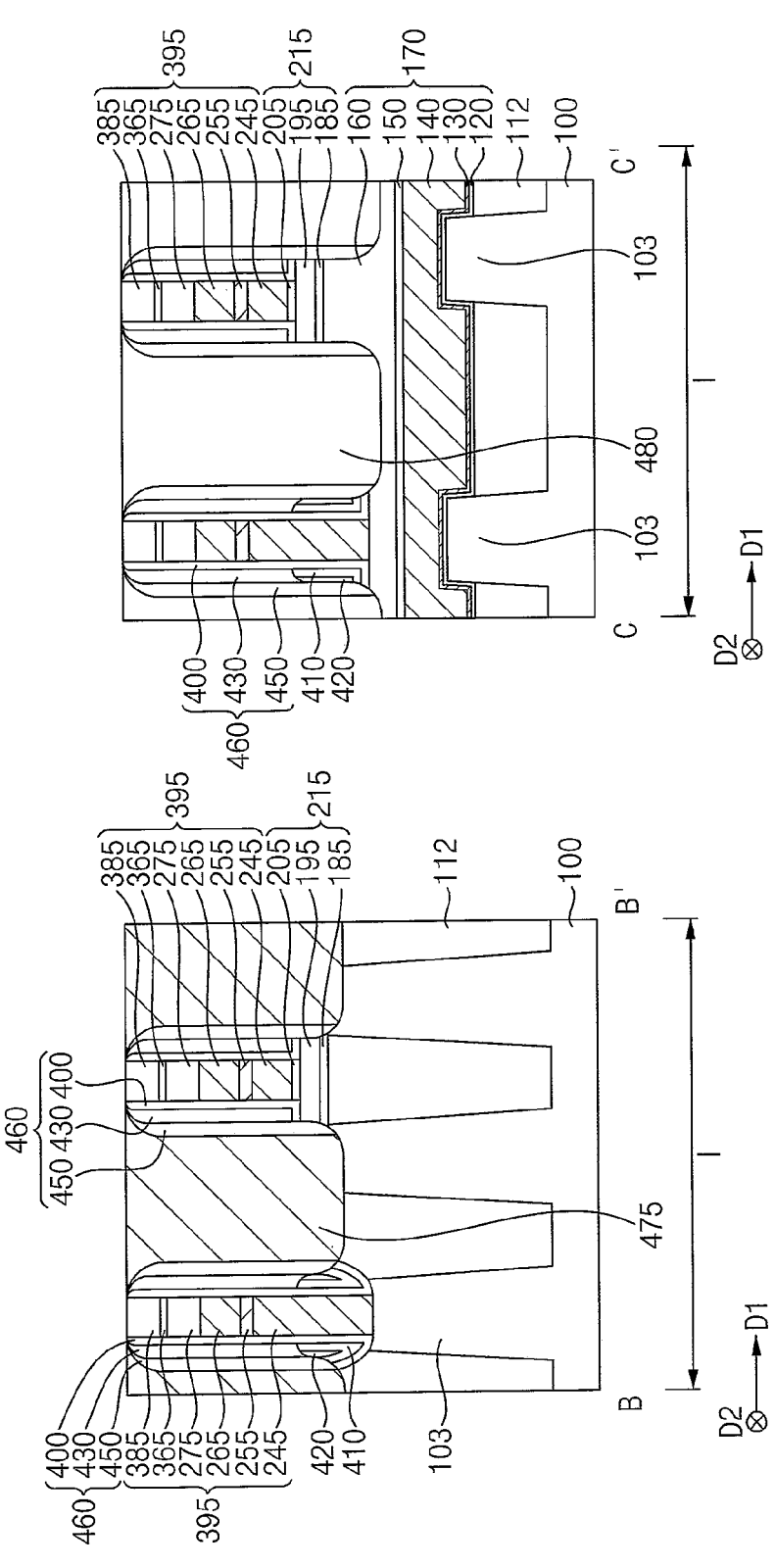

Referring to FIGS. 29 to 31, a third mask having third openings may be formed on the second capping pattern 385, the second capping layer 380 and the lower contact plug layer. The third openings of the third mask may be spaced apart from each other in the second direction D2, and each of the third openings may extend in the first direction D1 on the first region I of the substrate 100. An etching process may be performed on the lower contact plug layer using the third mask as an etching mask.

In example embodiments, each of the third openings may overlap the first gate structure 170 on the first region I of the substrate 100 in the vertical direction. As the etching process is performed, a fourth opening may be formed to expose an upper surface of the first gate mask 160 of the first gate structure 170 between the bit line structures 395 on the first region I of the substrate 100.

After removing the third mask, a third capping pattern 480 may be formed on the first region I of the substrate 100 to fill the fourth opening. The third capping pattern 480 may include or may be formed of nitride, e.g., silicon nitride. In example embodiments, the third capping pattern 480 may extend in the first direction D1 between the bit line structures 395, and a plurality of third capping patterns 480 may be spaced apart from each other in the second direction D2.

Thus, the lower contact plug layer 470 extending in the second direction D2 between the bit line structures 395 on the first region I of the substrate 100 may be divided into a plurality of lower contact plugs 475 spaced apart from each other in the second direction D2 by the third capping patterns 480.

Figure 32:
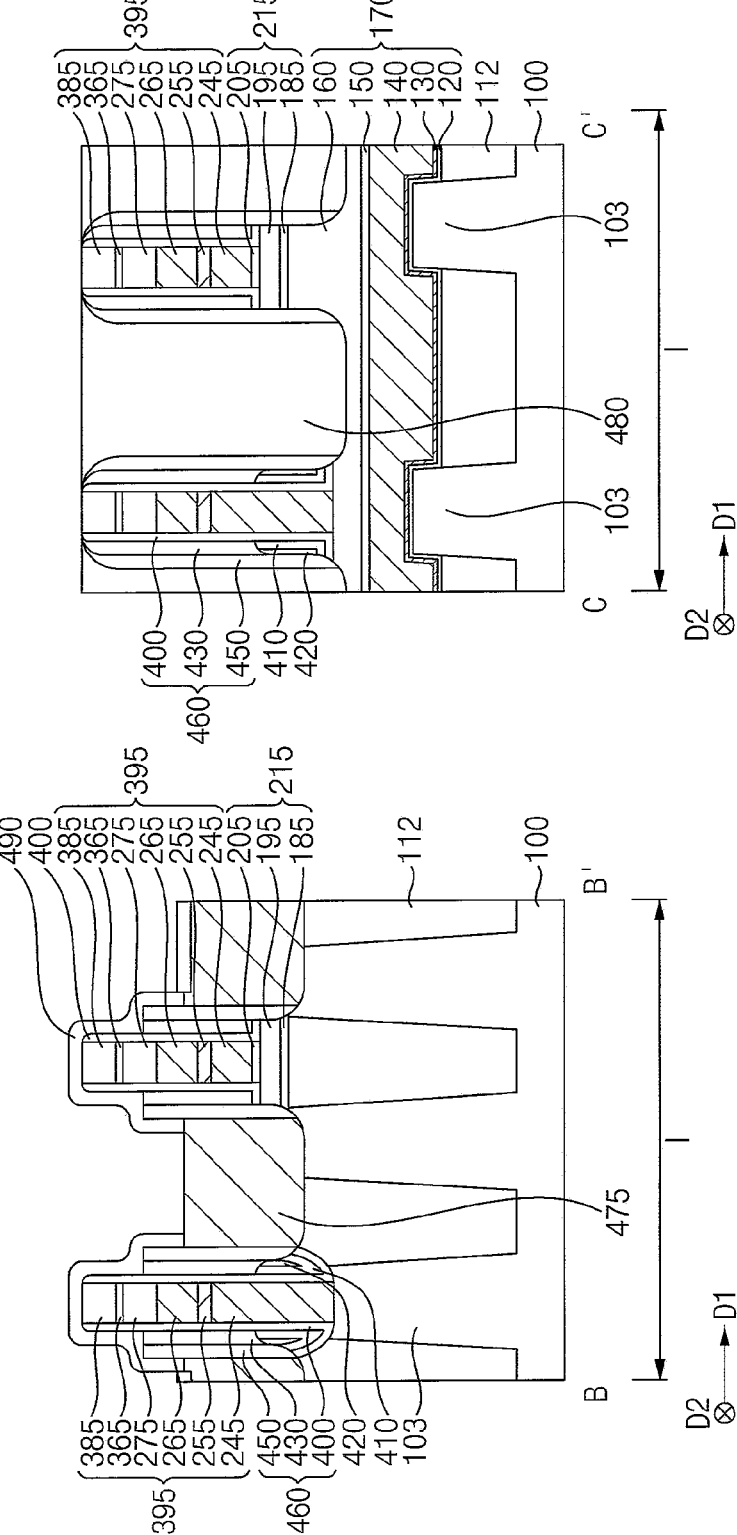

Referring to FIG. 32, an upper portion of the lower contact plug 475 may be removed to expose an upper portion of the third spacer structure 460 on the sidewall of the bit line structure 395, and upper portions of the sixth and seventh spacers 430 and 450 of the exposed third spacer structure 460 may be removed.

An etch back process may be further performed to remove an upper portion of the lower contact plug 475. Thus, an upper surface of the lower contact plug 475 may be lower than uppermost surfaces of the sixth and seventh spacers 430 and 450.

An eighth spacer layer may be formed on the bit line structure 395, the third spacer structure 460, the third capping pattern 480, the second capping layer 380, and the lower contact plug 475, and may be anisotropically etched so that an eighth spacer 490 may be formed to cover the third spacer structure 460 on each of opposite sidewalls of the bit line structure 395 in the first direction D1. An upper surface of the lower contact plug 475 may be exposed without being covered by the eighth spacer 490.

Figure 33:
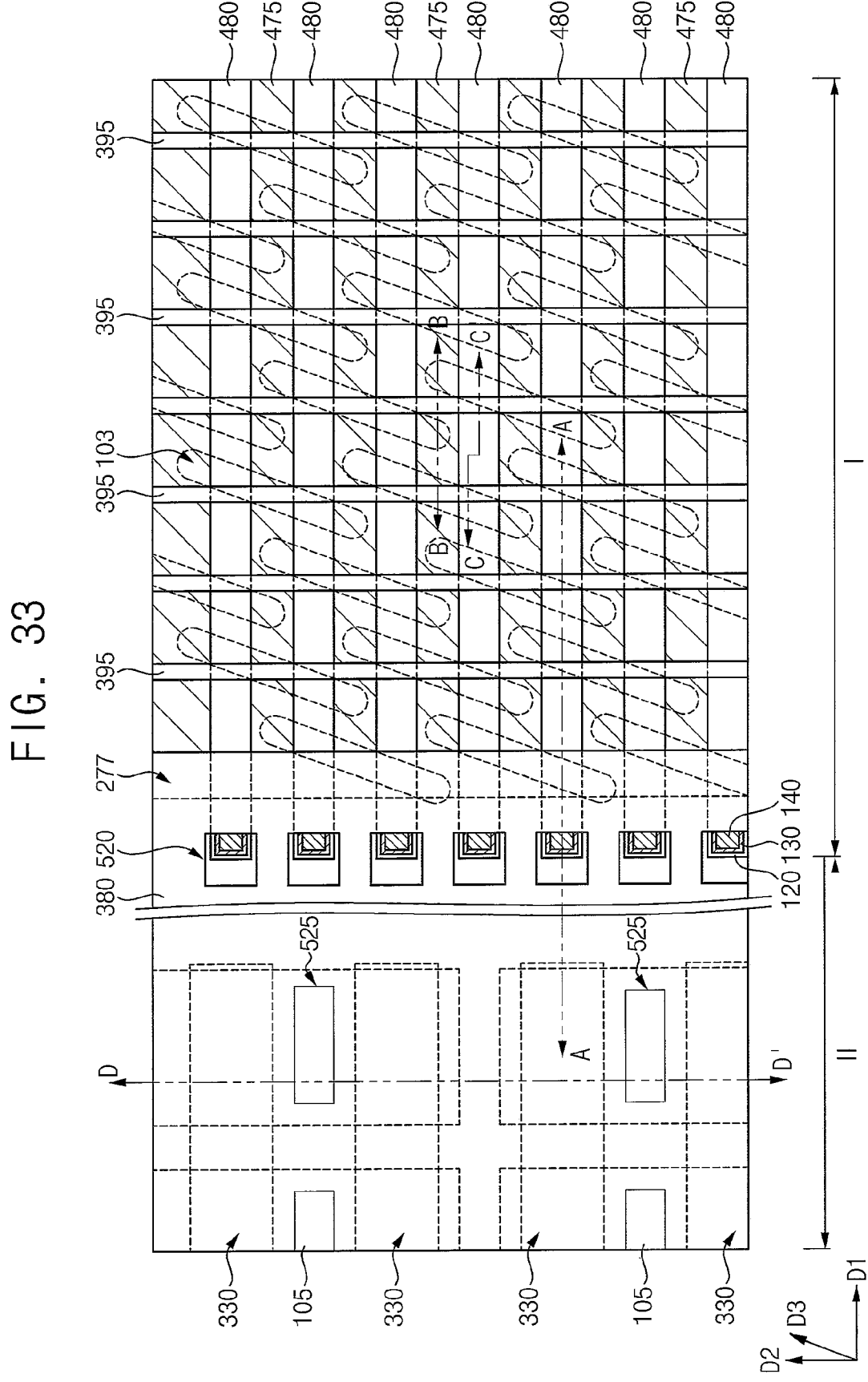
Figure 34:
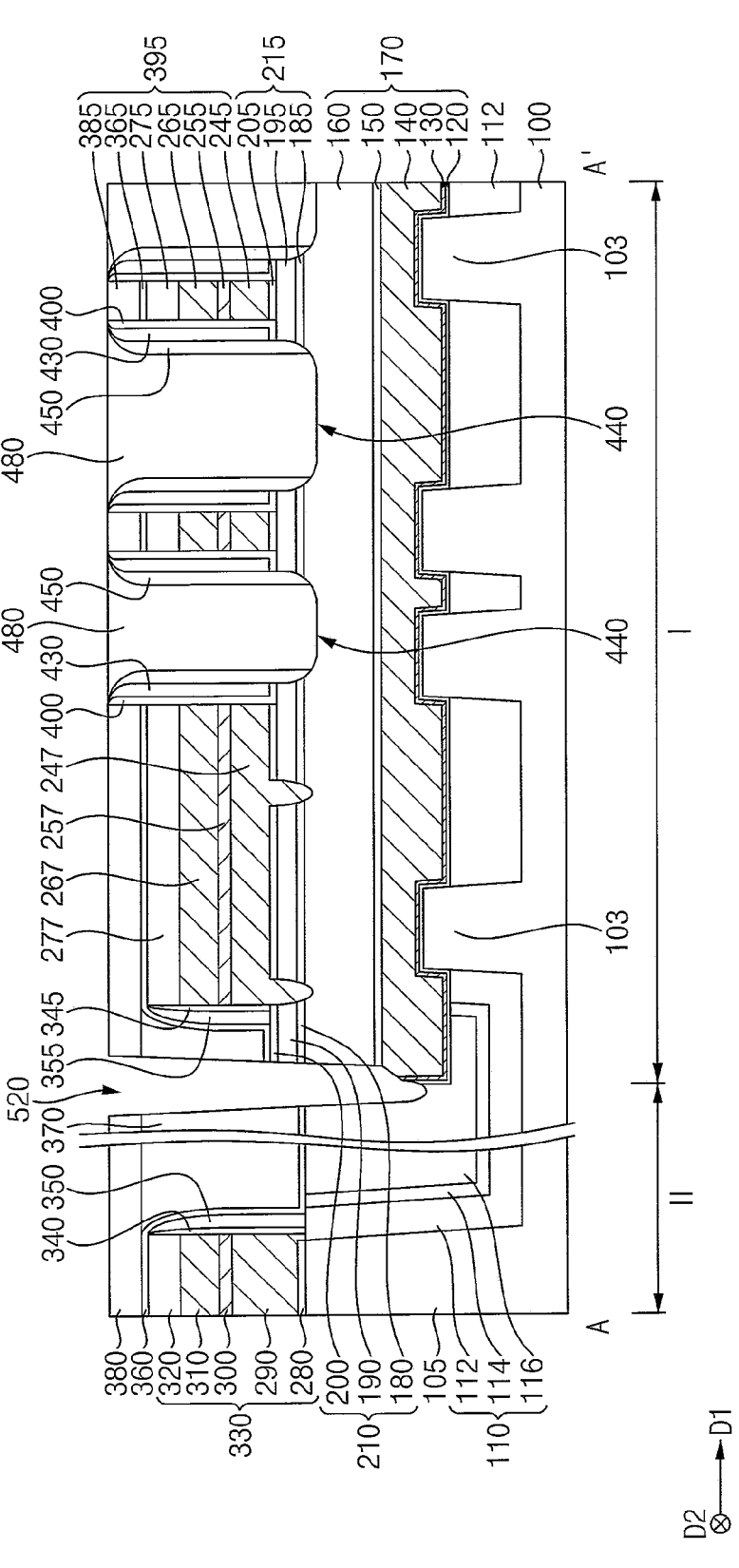
Figure 35:
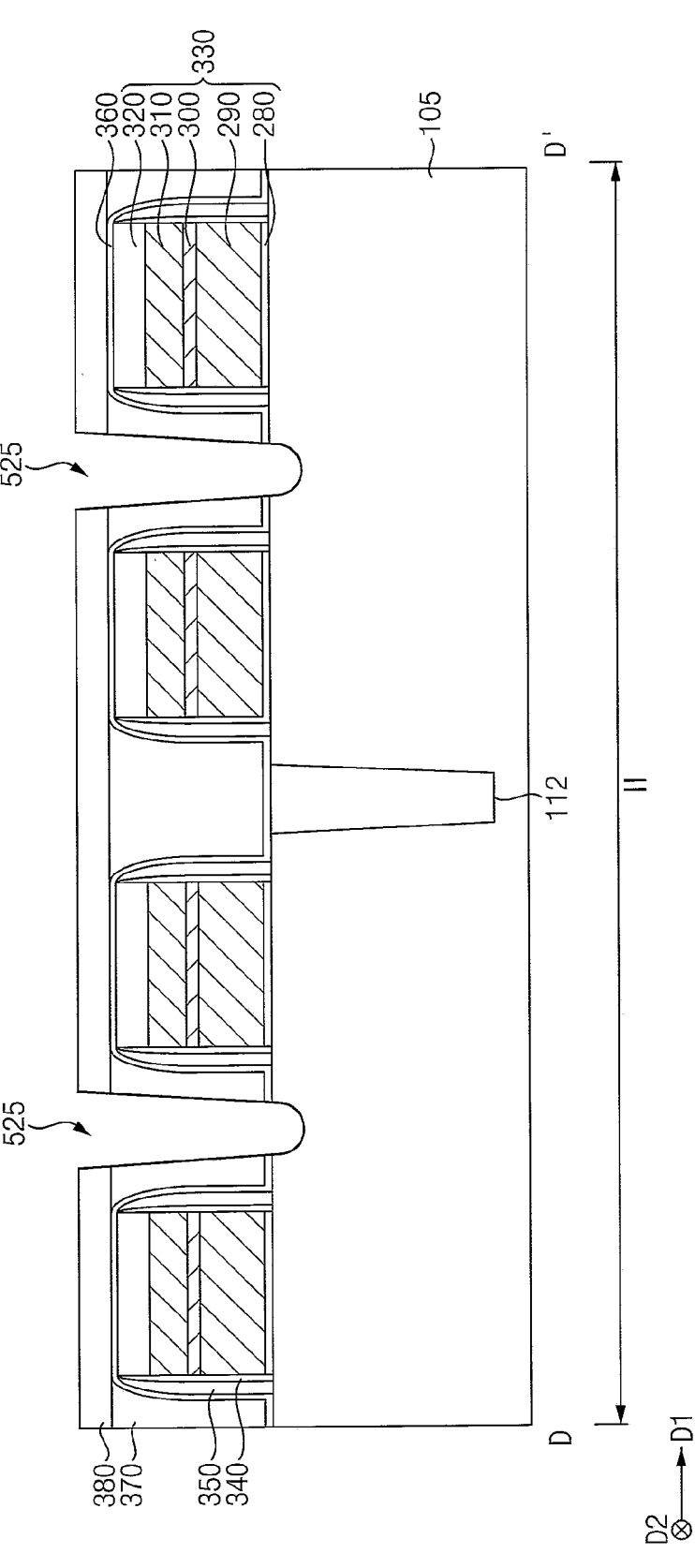

Referring to FIGS. 33 to 35, a first sacrificial layer may be formed on the second and third capping patterns 385 and 480, the eighth spacer 490, and the lower contact plug 475. An upper portion of the first sacrificial layer may be planarized to expose upper surfaces of the second and third capping patterns 385 and 480 and the second capping layer 380.

The first sacrificial layer may include or may be formed of, e.g., SOH, ACL, etc.

A fifth opening 520 may be formed at a boundary between the first and second regions I and II of the substrate 100, extending through a portion of the second capping layer 380, the second insulating interlayer 370, the first etch stop layer 360, the insulation layer structure 210, the first gate mask 160, the second conductive pattern 150, and the isolation pattern structure 110 under the portion of the second capping layer 380 to expose the first conductive pattern 140. The fifth opening 520 may also expose the third barrier pattern 130 and the first gate insulation pattern 120 on the sidewall of the first conductive pattern 140.

A sixth opening (not shown) may also be formed in the second region II of the substrate 100, extending through a portion of the second capping layer 380, the second insulating interlayer 370, the first etch stop layer 360, and an upper portion of the second active pattern 105 between the second gate structures 330.

Figure 36:
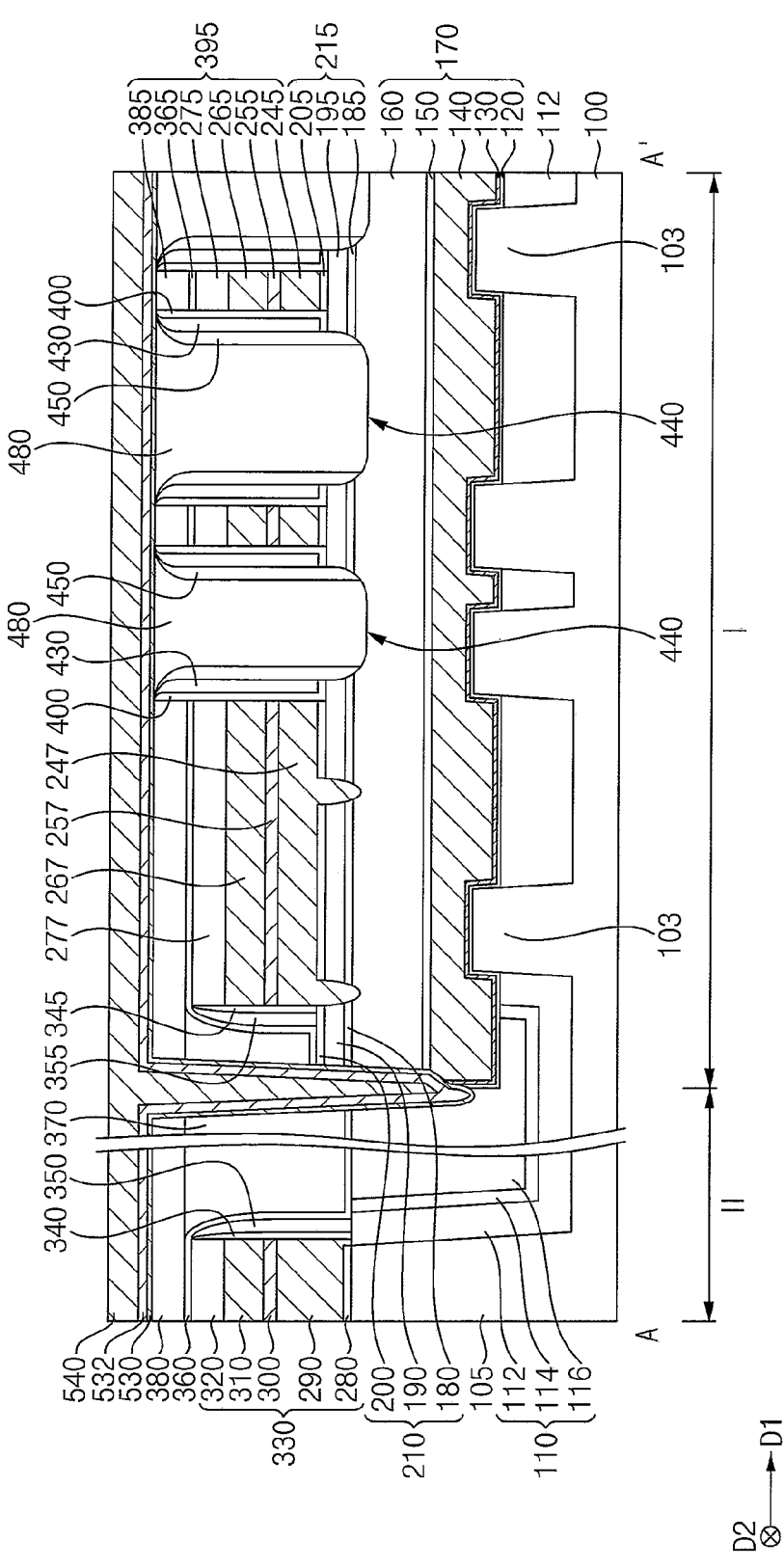
Figure 37:
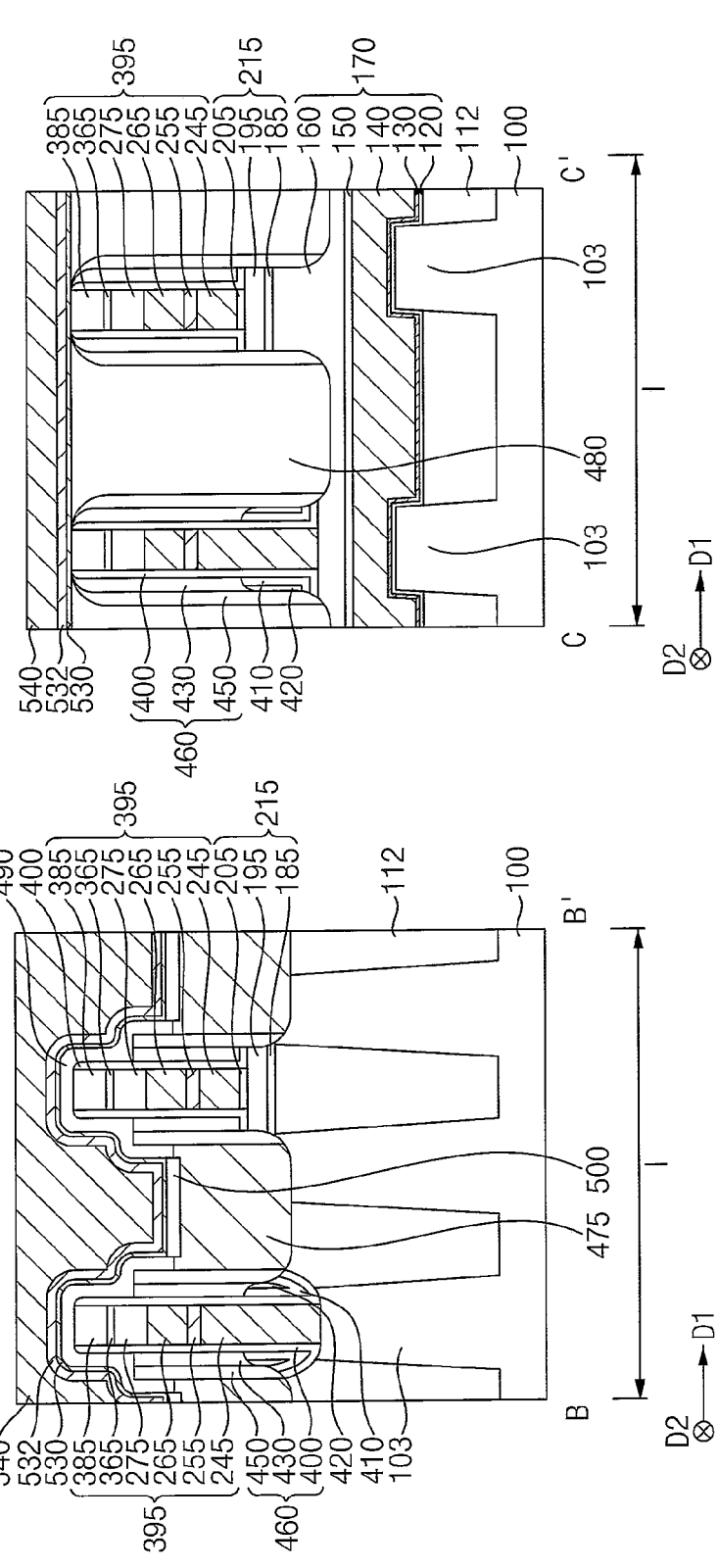
Figure 38:
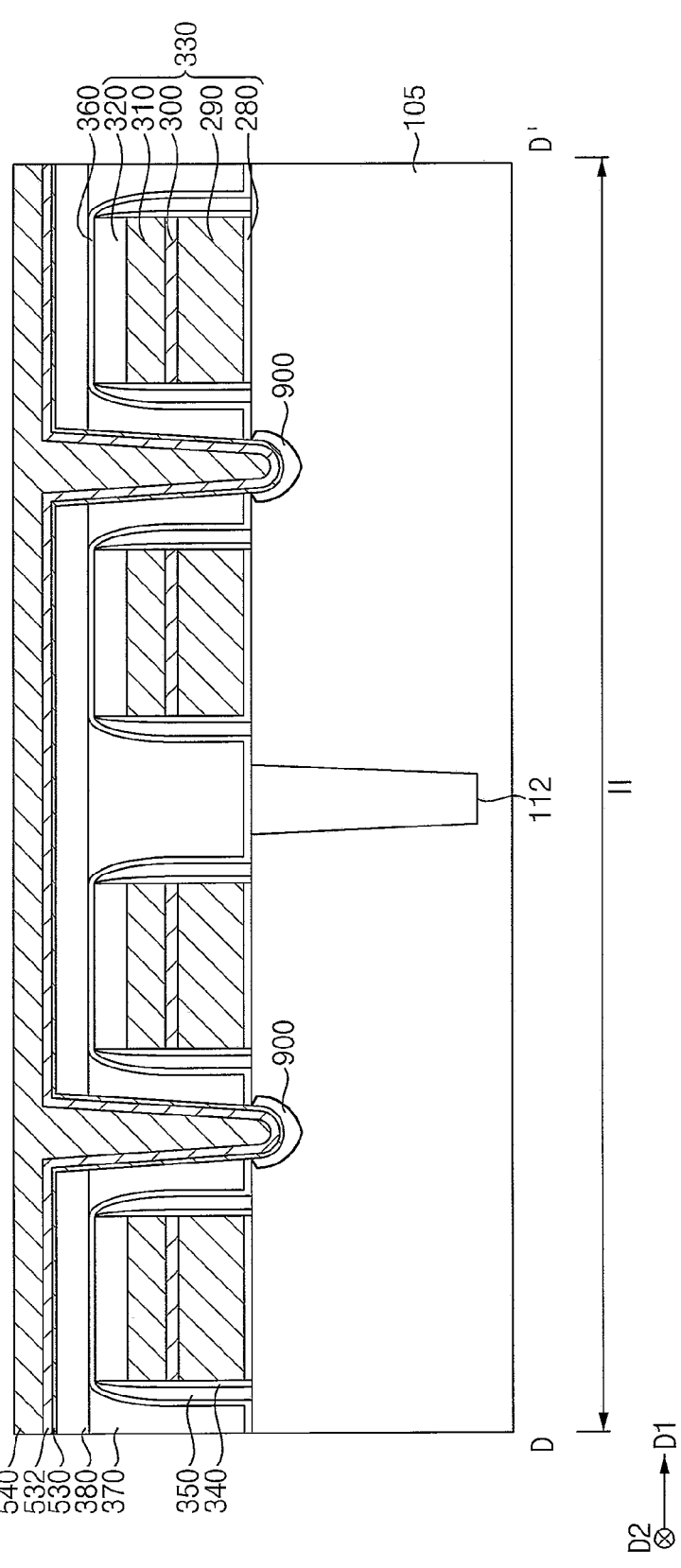
Figure 39:
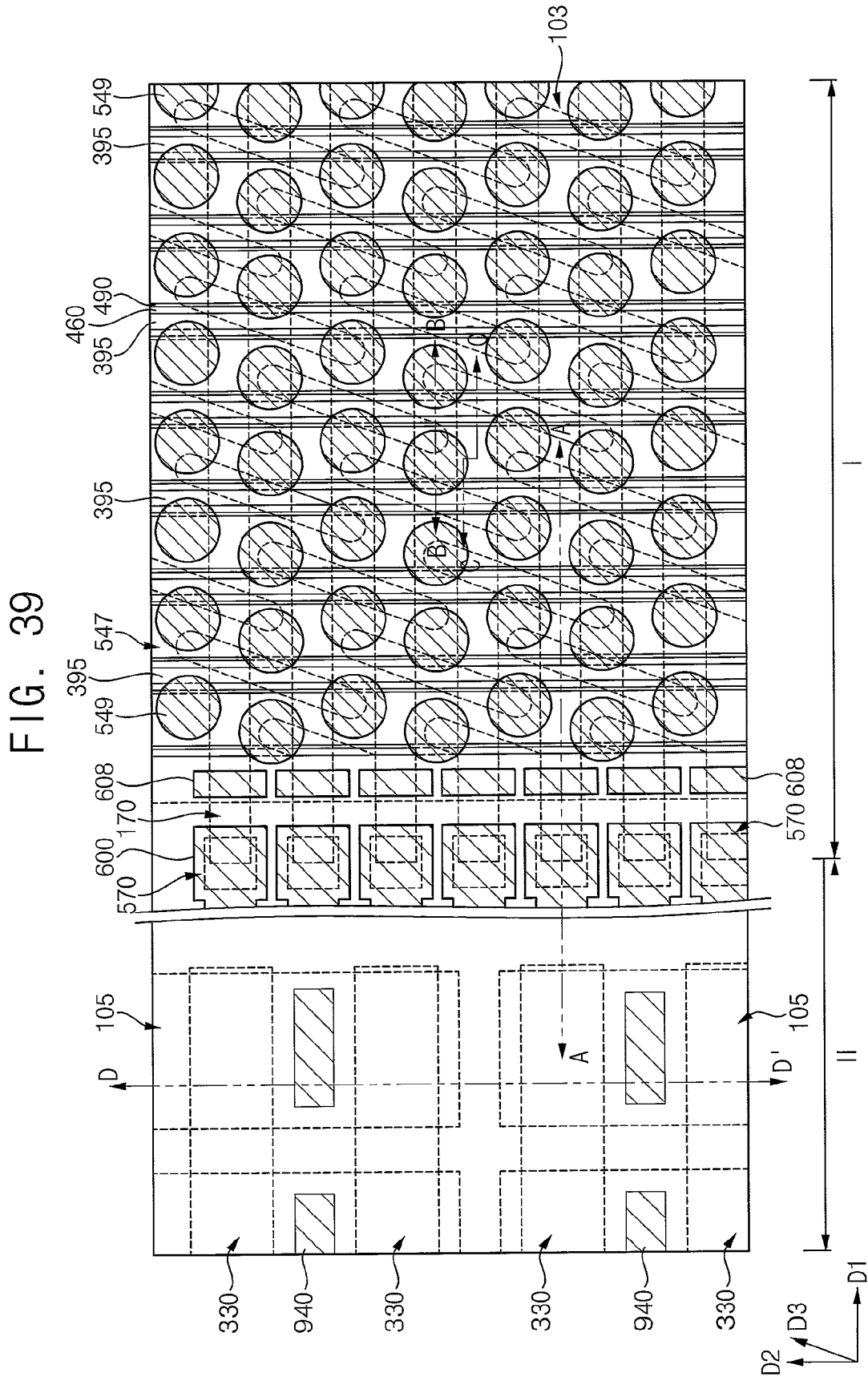
Figure 40:
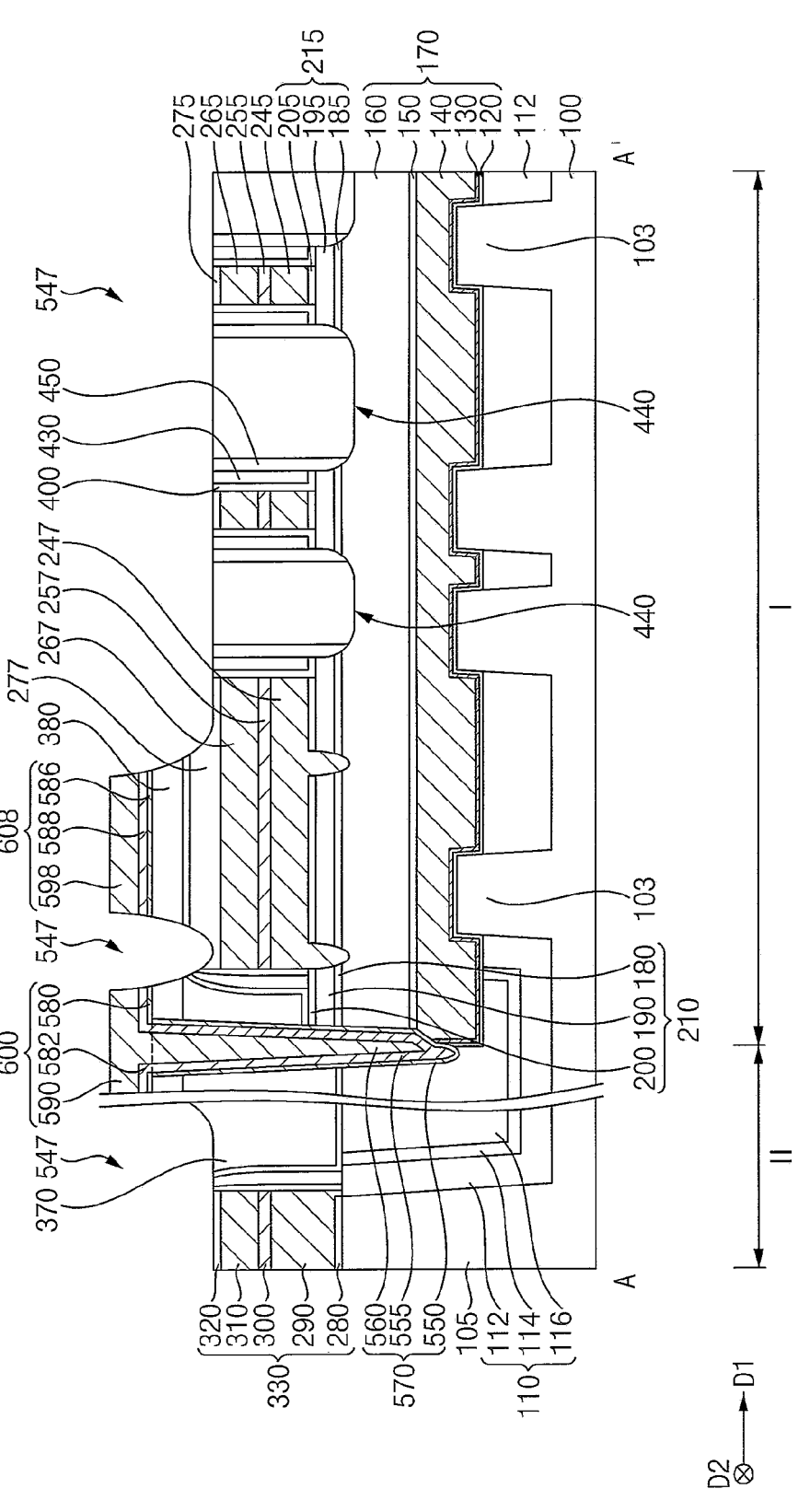
Figure 41:
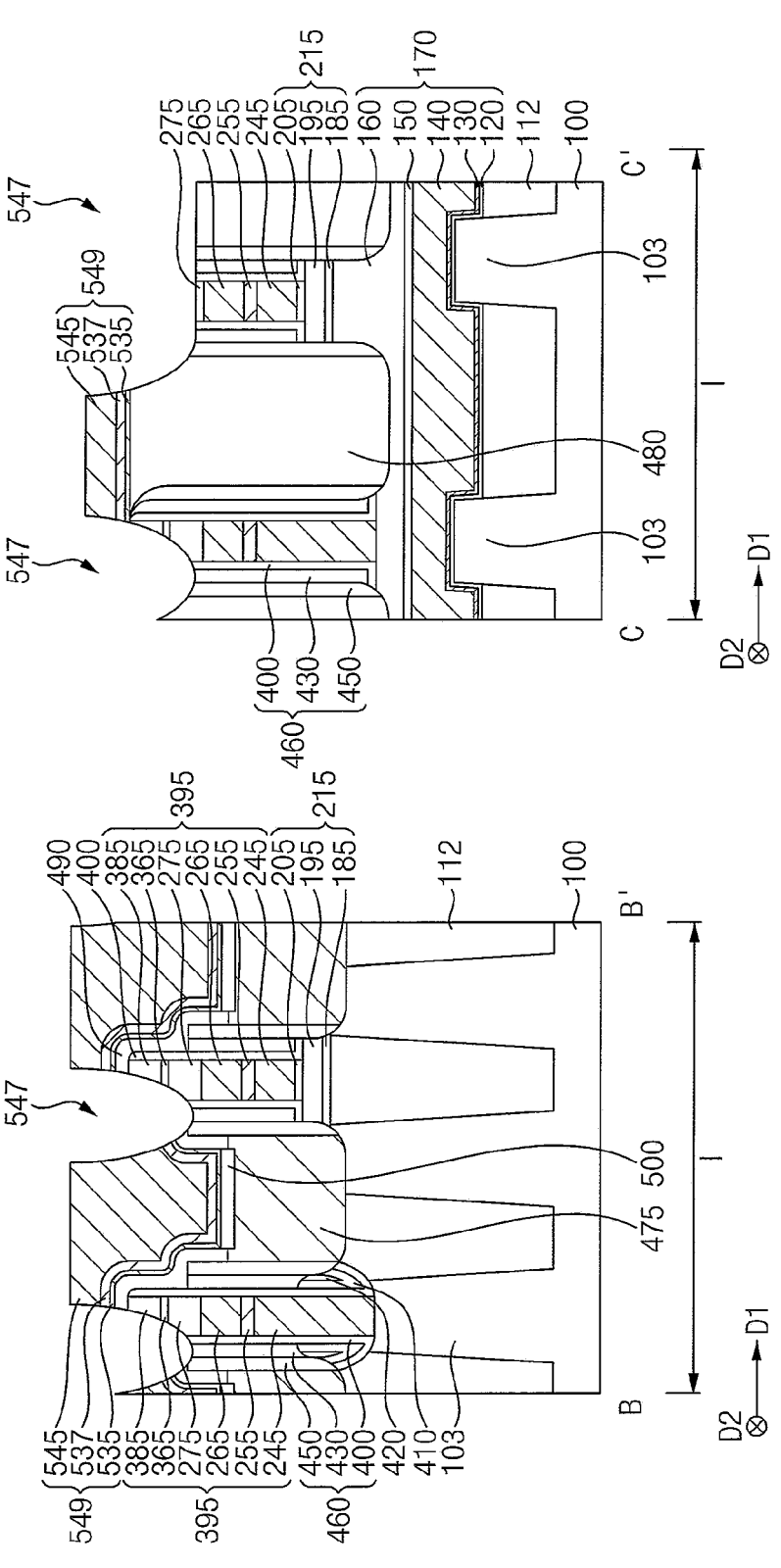
Figure 42:
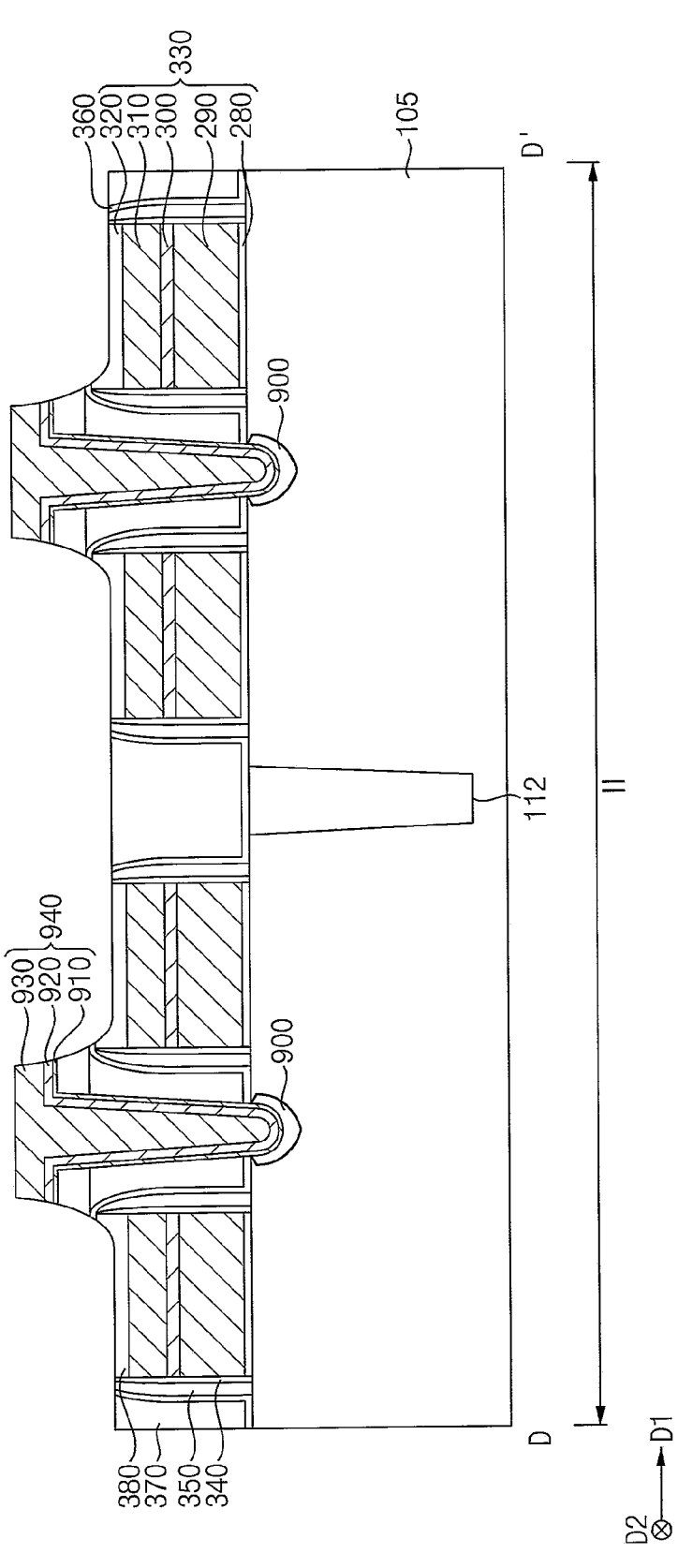

Referring to FIGS. 36 to 38, the first sacrificial layer may be removed by, e.g., an ashing process and/or a stripping process, and processes that are substantially the same as or similar to those illustrated with reference to FIGS. 1 to 5 may be performed.

For example, on the second region II of the substrate 100, a second metal silicide layer 900 may be formed on a portion of the second active pattern 105 adjacent to a bottom of the sixth opening 525, and seventh and eight barrier layers 530 and 532 may be sequentially formed on an upper surface of the second metal silicide layer 900, a sidewall of the sixth opening 525 and an upper surface of the second capping layer 380. The second metal silicide layer 900 may include or may be formed of, e.g., cobalt titanium silicide ($CoTi_xSi_y$), where x and y are real numbers, as the first metal silicide layer as shown in FIG. 5.

On the first region I of the substrate 100, a third metal silicide layer 500 may be formed on the lower contact plug 475, and the seventh and eight barrier layers 530 and 532 may be sequentially formed on a bottom and a sidewall of the fifth opening 520, and upper surfaces of the third metal silicide layer 500, the second and third capping patterns 385 and 480, and the eighth spacer 490.

A third metal layer 540 may be formed on the eighth barrier layer 532 to fill a space between the bit line structures 395 and the fifth and sixth openings 520 and 525.

The seventh barrier layer 530 may include or may be formed of metal, e.g., titanium, tantalum, etc., the eighth barrier layer 532 may include or may be formed of a metal nitride, e.g., titanium nitride, tantalum nitride, etc., and the third metal layer 540 may include or may be formed of metal, e.g., tungsten, titanium, tantalum, etc.

A planarization process may be further performed on the third metal layer 540. The planarization process may include a chemical-mechanical polishing (CMP) process and/or an etch back process.

Referring to FIGS. 39 to 42, the third metal layer 540 and the seventh and eighth barrier layers 530 and 532 may be patterned to form an upper contact plug 549.

The upper contact plug 549 may be formed on the first region I of the substrate 100. A wiring 600 may be formed at the boundary between the first and second regions I and II of the substrate 100. A conductive pad 608 may be formed on a portion of the first region I of the substrate 100 adjacent to the second region II of the substrate 100 in the first direction D1, and a first contact plug structure 940 may be formed on the second region II of the substrate 100. A seventh opening 547 may be formed among the upper contact plug 549, the wiring 600, the conductive pad 608, and the first contact plug structure 940.

The seventh opening 547 may be formed by removing not only the third metal layer 540 and the seventh and eighth barrier layers 530 and 532 but also the second and third capping patterns 385 and 480, the second capping layer 380, the third spacer structure 460, the eighth spacer 490, the first etch stop layer 360, the first etch stop pattern 365, the first mask 275, the second gate mask 320, and the first and second spacer structures.

As the seventh opening 547 is formed, the third metal layer 540 and the seventh and eighth barrier layers 530 and 532 may be transformed into a third metal pattern 545 and seventh and eighth barrier pattern 535 and 537 covering a lower surface of the third metal pattern 545, which may form the upper contact plug 549. In example embodiments, a plurality of upper contact plugs 549 may be formed to be spaced apart from each other in the first and second directions D1 and D2, and may be arranged in a honeycomb pattern or a lattice pattern when viewed in a plan view. Each of the upper contact plugs 549 may have a shape of a circle, an ellipse, or a polygon when viewed in a plan view.

The lower contact plug 475, the third metal silicide layer 500, and the upper contact plug 549 sequentially stacked on the first region I of the substrate 100 may form a second contact plug structure.

The wiring 600 may include a fourth metal pattern 590 and ninth and tenth barrier patterns 580 and 582 covering a lower surface of the fourth metal pattern 590. The conductive pad 608 may include a fifth metal pattern 595 and eleventh and twelfth barrier patterns 586 and 588 covering a lower surface of the fifth metal pattern 595. A third contact plug structure 570 including a sixth metal pattern 560 and thirteenth and fourteenth barrier patterns 550 and 555 may be formed in the fifth opening 520.

In example embodiments, the wiring 600 may extend from the boundary between the first and second regions I and II of the substrate 100 toward the second region II of the substrate 100 in the first direction D1, and a plurality of wirings 600 may be spaced apart from each other in the second direction D2. In example embodiments, the wiring 600 may overlap the fifth opening 520 in the vertical direction.

At least one of the wirings 600 may be connected to the first contact plug structure 940. In example embodiments, the first contact plug structure 940 may include a seventh metal pattern 930 and fifteenth and sixteenth barrier patterns 910 and 920 covering a lower surface of the seventh metal pattern 930.

In some embodiments, the sixth spacer 430 may be removed to form an air gap connected to the seventh opening 547. In this case, the sixth spacer 430 may be removed by, e.g., a wet etching process.

Figure 43:
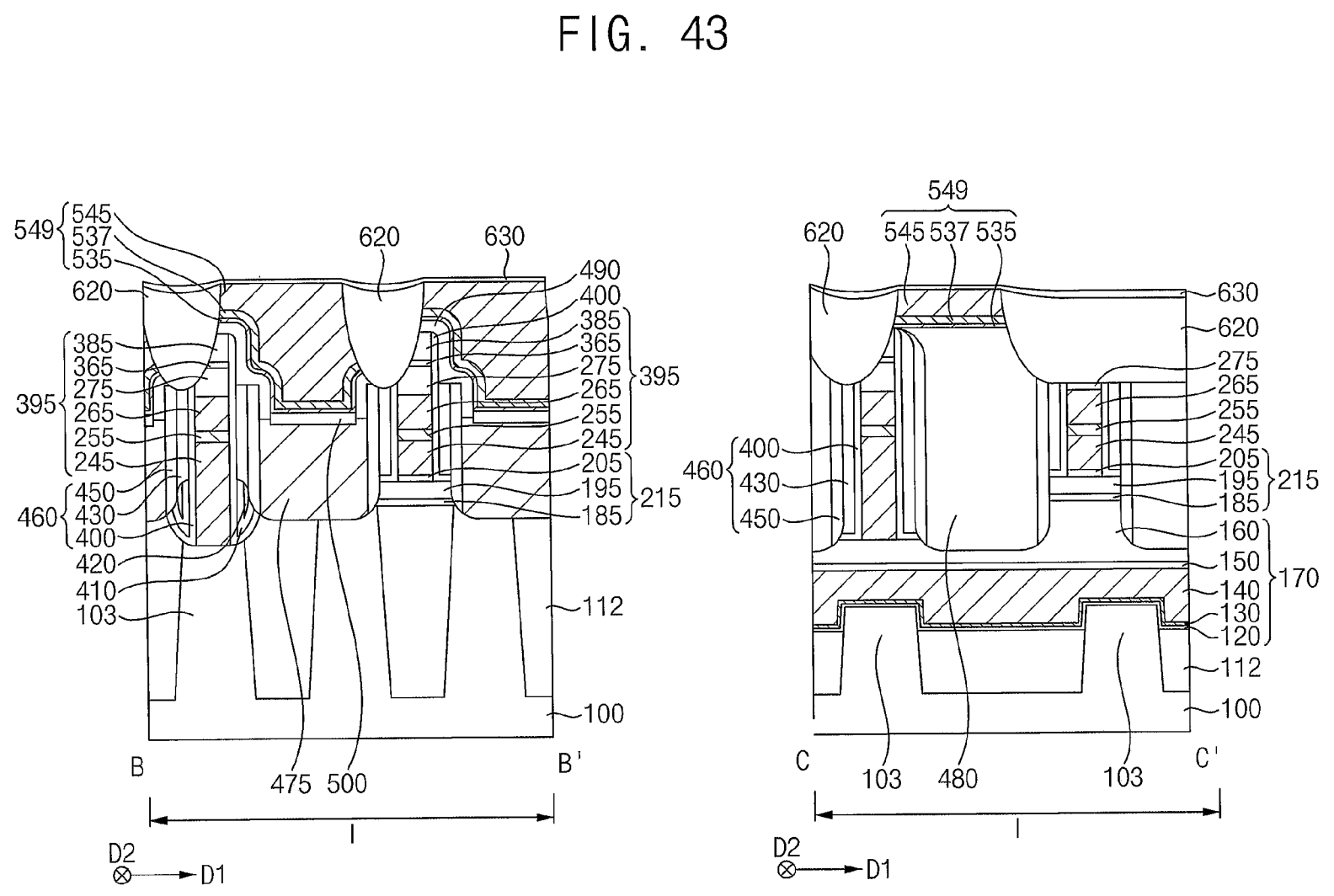
Figure 44:
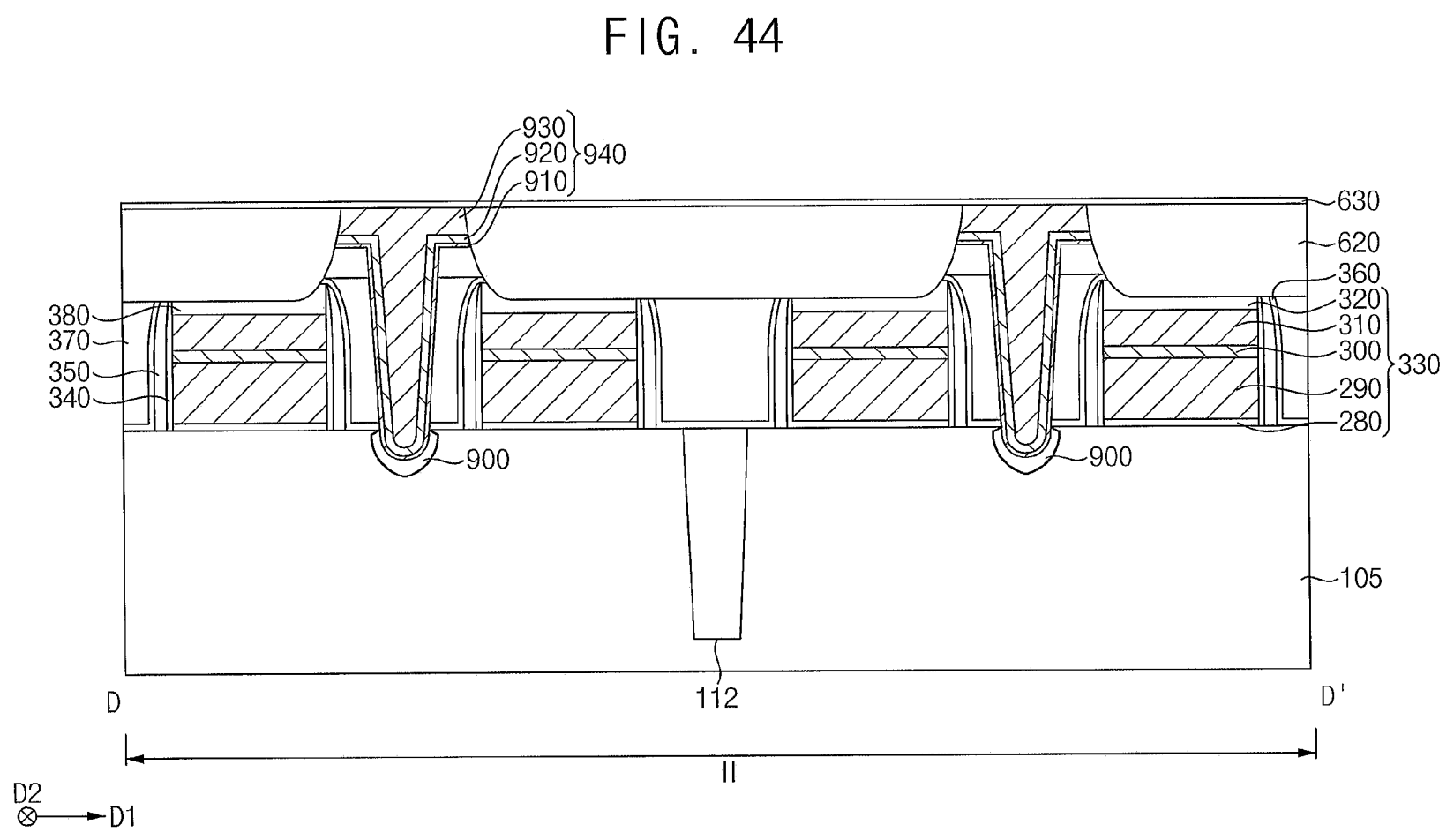

Referring to FIGS. 43 and 44, a sixth insulation layer 620 may be formed to fill the seventh opening 547. A second etch stop layer 630 may be formed on the sixth insulation layer 620, the upper contact plug 549, the wiring 600, the conductive pad 608, and the first contact plug structure 940.

The sixth insulation layer 620 may include or may be formed of nitride, e.g., silicon nitride, and the second etch stop layer 630 may include or may be formed of nitride, e.g., silicon boronitride, silicon carbonitride, etc.

If the air gap connected to the seventh opening 547 is formed, the sixth insulation layer 620 may include or may be formed of a material having a low gap filling characteristic, and thus the air gap may not be filled with the sixth insulation layer 620 but remain. The air gap may also be referred to as an air spacer.

Figure 45:
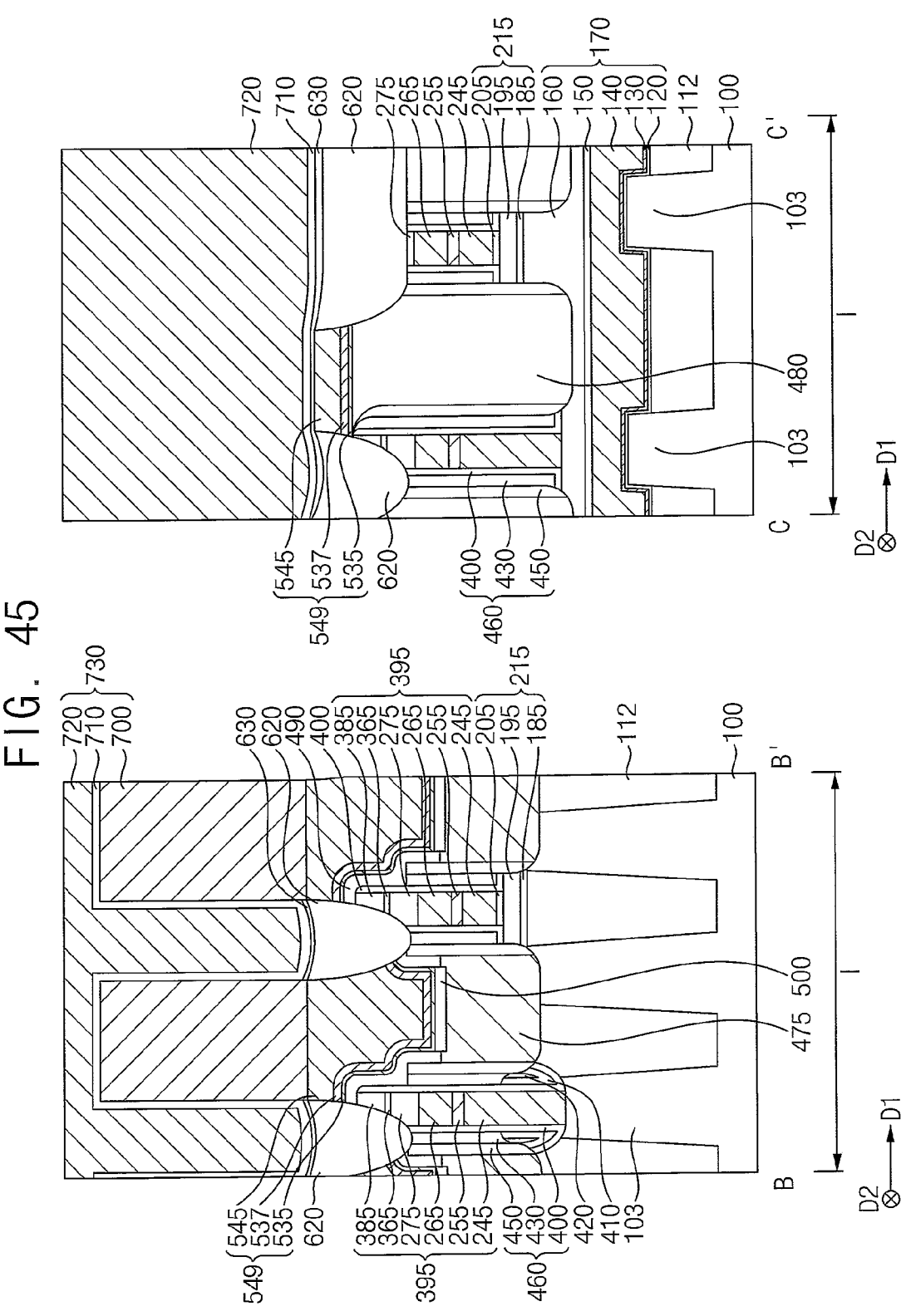
Figure 46:
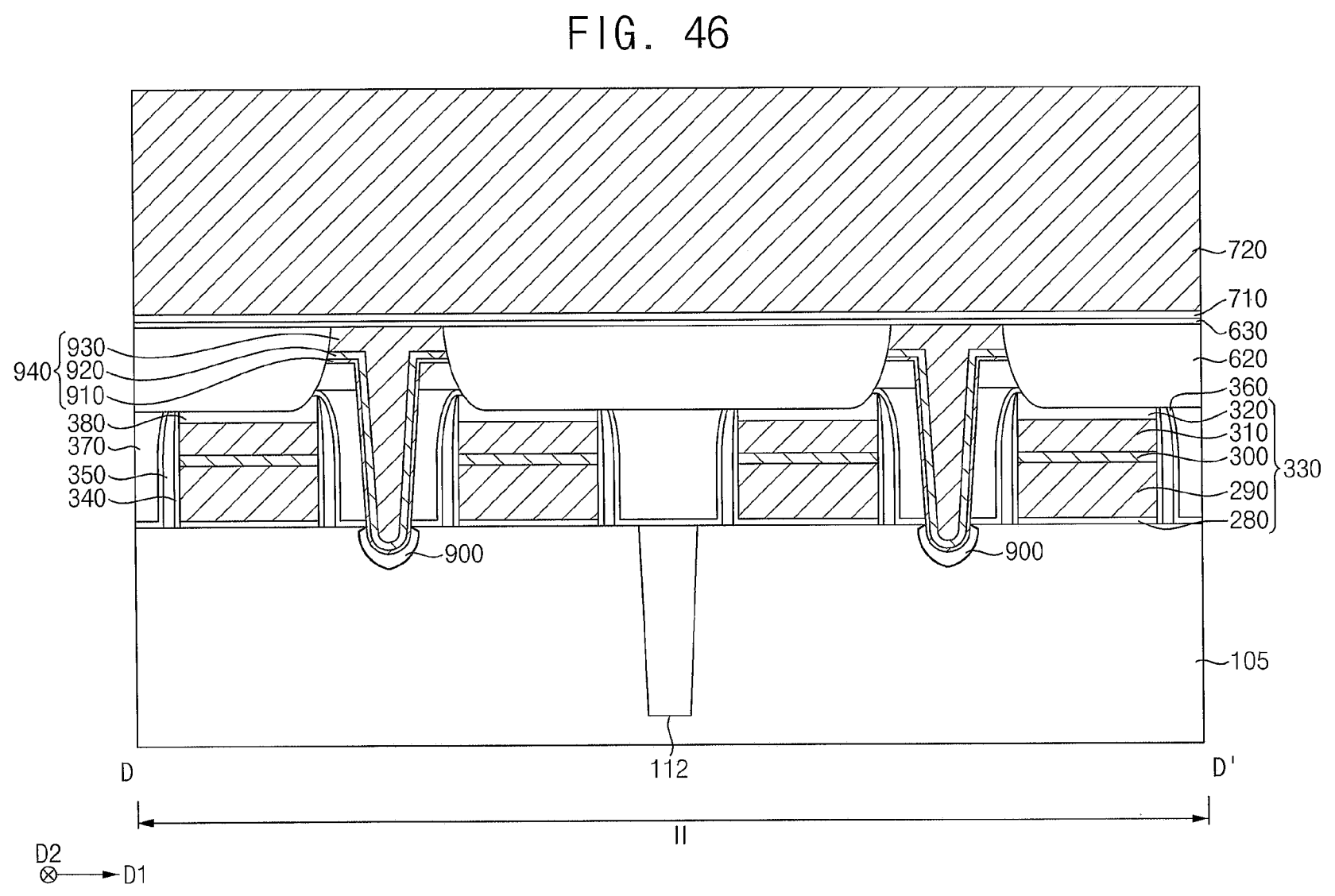

Referring to FIGS. 45 and 46, a mold layer may be formed on the second etch stop layer 630, and a portion of the mold layer and a portion of the second etch stop layer 630 thereunder may be etched to form eighth opening exposing and upper surface of the upper contact plug 549.

A lower electrode layer may be formed to fill the eighth opening, and may be planarized to expose an upper surface of the mold layer, thereby forming a lower electrode 700 having a pillar shape in the eighth opening. In an embodiment, the lower electrode 700 may have a cup shape or a hollow cylindrical shape with a closed bottom end. In example embodiments, a plurality of lower electrodes 700 may be arranged in a honeycomb pattern when viewed in a plan view.

The mold layer may be removed by a wet etching process using an etching solution, e.g., LAL. A dielectric layer 710 may be formed on an upper surface and a sidewall of the lower electrode 700. An upper electrode 720 may be formed on the dielectric layer 710. Thus, a capacitor 730 including the lower electrode 700, the dielectric layer 710 and the upper electrode 720 sequentially stacked may be formed.

The lower electrode 700 may include or may be formed of, e.g., metal, a metal nitride, a metal silicide, etc., the dielectric layer 710 may include or may be formed of a metal oxide, e.g., hafnium oxide, zirconium oxide, etc., and the upper electrode 720 may include or may be formed of a metal nitride, e.g., titanium nitride or doped silicon-germanium.

By the above processes, the semiconductor device may be manufactured.

The semiconductor device may have following structural characteristics.

In an embodiment, the semiconductor device may include the first gate structure 170 buried in a cell region I of the substrate 100 including the cell region I and the peripheral circuit region II and extending in the first direction D1, the bit line structure 395 on the cell region of the substrate 100 and extending in the second direction D2, the second contact plug structure 475, 500 and 549 on the first active pattern 103 adjacent to the bit line structure 395, the capacitor 730 on the second contact plug structure 475, 500 and 549, the second gate structure 330 on the peripheral circuit region II of the substrate 100, the first contact plug structure 940 on the second active pattern 105 adjacent to the second gate structure 330, and the second metal silicide layer 900 on the second active pattern 105 and contacting a lower surface of the first contact plug structure 940.

In example embodiments, a lower portion of the first contact plug structure 940 may fill the sixth opening 525 on the second active pattern 105, and may include the seventh metal pattern 930 containing a first metal, the sixteenth barrier pattern 920 covering the lower surface and the sidewall of the seventh metal pattern 930 and containing a nitride of a second metal, and the fifteenth barrier pattern 910 covering the lower surface and the sidewall of the sixteenth barrier pattern 920 and contacting the second metal silicide layer 900 and containing a third metal. The second metal silicide layer 900 may include or may be formed of the third metal, a fourth metal different from the third metal, and silicon.

In an example embodiment, the third metal may be titanium, the fourth metal may be cobalt, and thus the second metal silicide layer 900 may include or may be formed of cobalt titanium silicide ($CoTi_xSi_y$), where x and y are real numbers.

In an example embodiment, the second and third metals may be the same as each other, and thus the fifteenth barrier pattern 910 may include or may be formed of titanium, and the sixteenth barrier pattern 920 may include or may be formed of titanium nitride.

In an example embodiment, the first metal may be tungsten.

Figure 47:
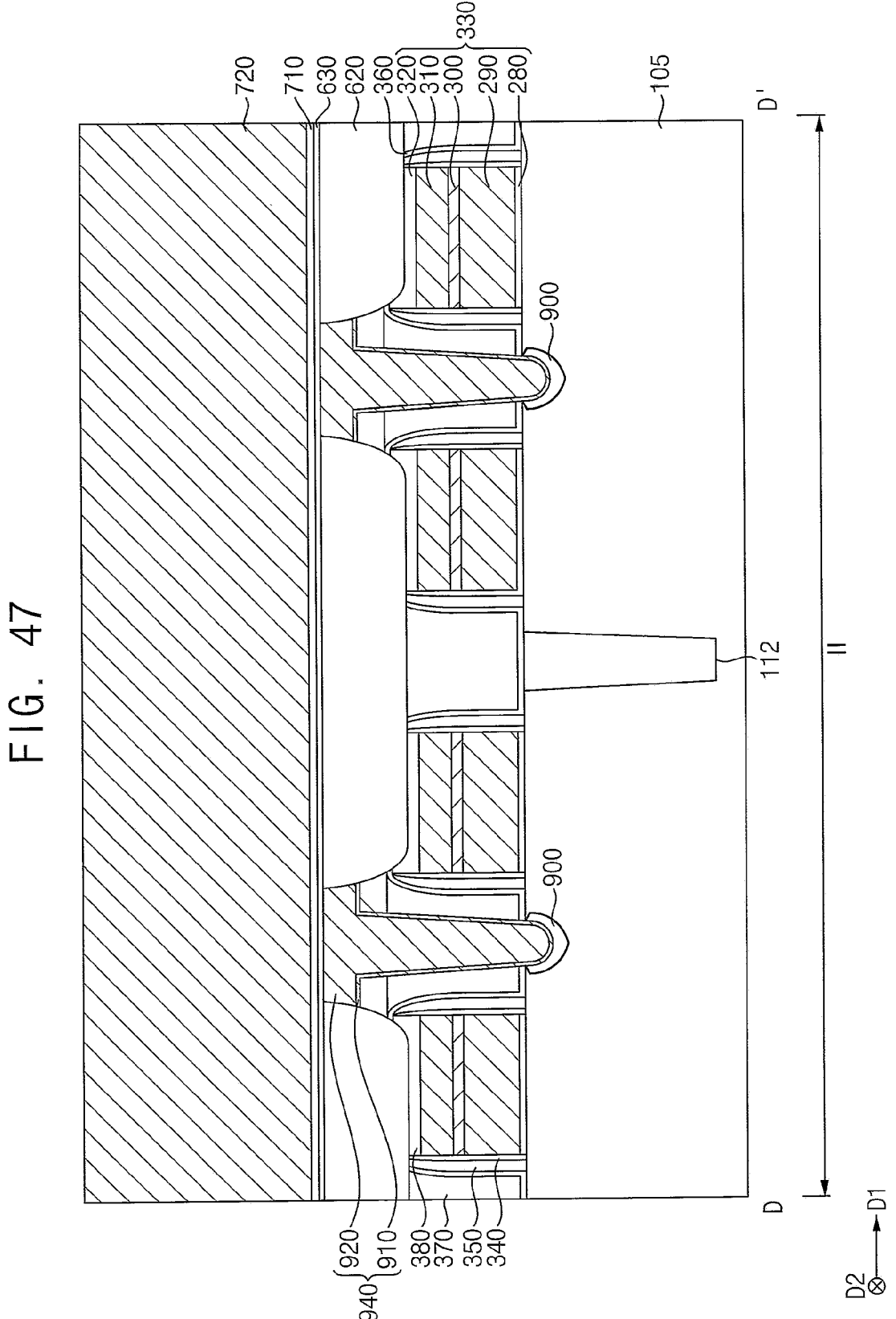
FIG. 47 is a cross-sectional view illustrating a semiconductor device in accordance with example embodiments.

FIG. 47 is a cross-sectional view illustrating a semiconductor device in accordance with example embodiments, which may correspond to FIG. 46.

This semiconductor device may be substantially the same as or similar to that of FIG. 46, except that the first contact plug structure 940 does not include the seventh metal pattern 930 but includes only the sixteenth barrier pattern 920 and the fifteenth barrier pattern 910 covering the lower surface of the sixteenth barrier pattern 920.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
   a metal silicide layer on a substrate; and
   a contact plug structure on the metal silicide layer,
   wherein the contact plug structure includes:
   a metal pattern including a first metal; and a first barrier pattern covering a lower surface and a sidewall of the metal pattern and contacting the metal silicide layer, wherein the first barrier pattern includes a second metal, wherein the metal silicide layer includes silicon, the second metal, and a third metal different from the second metal, wherein the second metal includes titanium, and the third metal includes cobalt, wherein the metal silicide layer includes cobalt titanium silicide (CoTixSiy), x and y being real numbers, and wherein a concentration of titanium at a portion of the metal silicide layer adjacent to the first barrier pattern is greater than a concentration of titanium at a portion of the metal silicide layer adjacent to the substrate.

2. The semiconductor device according to claim 1, wherein the first metal includes tungsten, titanium, or tantalum.

3. The semiconductor device according to claim 1, wherein the metal pattern includes nitride of the first metal.

4. The semiconductor device according to claim 3, wherein the metal pattern includes titanium nitride.

5. The semiconductor device according to claim 1, further comprising:

a second barrier pattern between the metal pattern and the first barrier pattern, the second barrier pattern lining the lower surface and the sidewall of the metal pattern and including a metal nitride.

6. The semiconductor device according to claim 5, wherein the first barrier pattern includes titanium, and the second barrier pattern includes titanium nitride.

7. The semiconductor device according to claim 1, wherein a lower portion of the contact plug structure fills a recess at the substrate, and wherein the metal silicide layer is disposed at a portion of the substrate adjacent to the recess.

8. A semiconductor device comprising:

a metal silicide layer on a substrate, the metal silicide layer including cobalt titanium silicide (CoTixSiy), wherein x and y are real numbers; and a contact plug structure on the metal silicide layer, wherein the contact plug structure includes:

a metal pattern including a first metal;

a first barrier pattern lining a lower surface and a sidewall of the metal pattern, the first barrier pattern including nitride of a second metal; and a second barrier pattern lining a lower surface and a sidewall of the first barrier pattern and contacting the metal silicide layer, the second barrier pattern including titanium, and wherein a concentration of titanium of a portion of the metal silicide layer adjacent to the first barrier pattern is greater than a concentration of titanium of a portion of the metal silicide layer adjacent to the substrate.

9. The semiconductor device according to claim 8, wherein the first barrier pattern includes titanium nitride.

10. The semiconductor device according to claim 8, wherein the metal pattern includes tungsten.

11. The semiconductor device according to claim 8, wherein a lower portion of the contact plug structure fills a recess at the substrate, and wherein the metal silicide layer is disposed at a portion of the substrate adjacent to the recess.

12. A semiconductor device comprising:

a substrate including a cell region and a peripheral circuit region;

a first gate structure extending in a first direction substantially parallel to an upper surface of the substrate in the cell region;

a bit line structure on the cell region of the substrate, the bit line structure extending in a second direction substantially parallel to the upper surface of the substrate and crossing the first direction;

a first contact plug structure on a portion of the substrate adjacent to the bit line structure;

a capacitor on the first contact plug structure;

a second gate structure on the peripheral circuit region of the substrate;

a second contact plug structure on a portion of the substrate adjacent to the second gate structure; and a metal silicide layer on the substrate, the metal silicide layer contacting a lower surface of the second contact plug structure, wherein the second contact plug structure includes:

a metal pattern including a first metal; and a first barrier pattern covering a lower surface and a sidewall of the metal pattern and contacting the metal silicide layer, the first barrier pattern including a second metal, wherein the metal silicide layer includes silicon, the second metal, and a third metal different from the second metal, wherein the second metal includes titanium, and the third metal includes cobalt, wherein the metal silicide layer includes cobalt titanium silicide (CoTixSiy), x and y being real numbers, and wherein a concentration of titanium of a portion of the metal silicide layer adjacent to the first barrier pattern is greater than a concentration of titanium of a portion of the metal silicide layer adjacent to the substrate.

13. The semiconductor device according to claim 12, wherein the metal pattern includes titanium nitride.

14. The semiconductor device according to claim 12, further comprising:

a second barrier pattern between the metal pattern and the first barrier pattern, the second barrier pattern including a metal nitride, wherein the first barrier pattern includes titanium.

* * * * *